United States Patent
Setz et al.

(10) Patent No.: US 9,478,761 B2
(45) Date of Patent: Oct. 25, 2016

(54) OPTOELECTRONIC COMPONENT HAVING A UV-PROTECTING SUBSTRATE AND METHOD FOR PRODUCING THE SAME

(71) Applicant: OSRAM OLED GmbH, Regensburg (DE)

(72) Inventors: Daniel Steffen Setz, Boeblingen (DE); Angela Eberhardt, Augsburg (DE); Manfred Deisenhofer, Altenmuenster (DE); Christina Wille, Friedberg (DE)

(73) Assignee: OSRAM OLED GmbH, Regensburg (DE)

( * ) Notice: Subject to any disclaimer, the term of this patent is extended or adjusted under 35 U.S.C. 154(b) by 47 days.

(21) Appl. No.: 14/396,780

(22) PCT Filed: Apr. 11, 2013

(86) PCT No.: PCT/EP2013/057628
§ 371 (c)(1),
(2) Date: Oct. 24, 2014

(87) PCT Pub. No.: WO2013/160119
PCT Pub. Date: Oct. 31, 2013

(65) Prior Publication Data
US 2015/0097165 A1    Apr. 9, 2015

(30) Foreign Application Priority Data
Apr. 26, 2012   (DE) .................. 10 2012 206 967

(51) Int. Cl.
*H01L 51/44*       (2006.01)
*H01L 51/52*       (2006.01)
(Continued)

(52) U.S. Cl.
CPC ............ *H01L 51/448* (2013.01); *C03C 8/14* (2013.01); *C03C 8/20* (2013.01); *C03C 17/04* (2013.01);
(Continued)

(58) Field of Classification Search
CPC .............. H01L 2924/12041; H01L 51/5284; H01L 51/5215; H01L 51/5253; H01L 51/5268; H01L 31/00; H01L 27/14; C03C 8/14; C03C 17/04
USPC ........ 438/28–29, 34, 69, 82, 99; 257/79, 88, 257/98, E21.211, E21.299, E21.527
See application file for complete search history.

(56) References Cited

U.S. PATENT DOCUMENTS 4,420,224 A * 12/1983 Kaufmann ............... 349/113
4,883,777 A * 11/1989 Yamanaka ............... 501/15
(Continued)

FOREIGN PATENT DOCUMENTS

CN        1871722 A     11/2006
DE   102008031533 A1    1/2010
(Continued)

OTHER PUBLICATIONS

International Search Report issued in the PCT/EP2013/057628 dated Aug. 8, 2013.
(Continued)

*Primary Examiner* — Mohsen Ahmadi
(74) *Attorney, Agent, or Firm* — Viering, Jentschura & Partner mbB

(57) ABSTRACT

An optoelectronic component may include a carrier, a protective layer on or above the carrier, a first electrode on or above the protective layer, an organic functional layer structure on or above the first electrode, and a second electrode on or above the organic functional layer structure. The protective layer has a lower transmission than the carrier for electromagnetic radiation having a wavelength of less than approximately 400 nm at least in one wavelength range. The protective layer includes a glass.

16 Claims, 11 Drawing Sheets

(51) Int. Cl.
    *C03C 1/04*     (2006.01)
    *C03C 8/20*     (2006.01)
    *C03C 8/14*     (2006.01)
    *C03C 17/04*     (2006.01)

(52) U.S. Cl.
    CPC ........ *H01L 51/5246* (2013.01); *H01L 51/5253* (2013.01); *H01L 51/5268* (2013.01); *Y02E 10/549* (2013.01); *Y02P 70/521* (2015.11)

(56) References Cited

U.S. PATENT DOCUMENTS

| | | | |
|---|---|---|---|
| 5,909,081 A | 6/1999 | Eida et al. | |
| 8,786,176 B2 | 7/2014 | Lecamp et al. | |
| 2005/0082971 A1 | 4/2005 | Couillard | |
| 2005/0116245 A1 | 6/2005 | Aitken et al. | |
| 2009/0308441 A1* | 12/2009 | Nayfeh ............ | H01L 31/02167 136/256 |
| 2010/0067101 A1* | 3/2010 | Suetsugu et al. ............. | 359/361 |
| 2011/0070456 A1 | 3/2011 | Philippens et al. | |
| 2012/0313134 A1 | 12/2012 | Vermersch et al. | |
| 2013/0221336 A1 | 8/2013 | Allano et al. | |

FOREIGN PATENT DOCUMENTS

| | | |
|---|---|---|
| EP | 0809420 B1 | 9/2002 |
| JP | 2008201608 A | 9/2008 |
| JP | 2008247626 A | 10/2008 |
| KR | 1020060112660 A | 11/2006 |
| KR | 1020080100636 A | 11/2008 |
| WO | 9625020 A1 | 8/1996 |
| WO | 2005043585 A2 | 5/2005 |
| WO | 2005083813 A2 | 9/2005 |
| WO | 2009083693 A2 | 7/2009 |
| WO | 2009134211 A1 | 11/2009 |
| WO | 2011089343 A1 | 7/2011 |
| WO | 2012007575 A1 | 1/2012 |
| WO | 2012017183 A1 | 2/2012 |

OTHER PUBLICATIONS

Chinese Office Action based on Application No. 201380022254.7(7 Pages and 9 pages of English translation) dated Mar. 24, 2016 (Reference Purpose Only).

* cited by examiner

OPTOELECTRONIC COMPONENT HAVING A UV-PROTECTING SUBSTRATE AND METHOD FOR PRODUCING THE SAME

RELATED APPLICATIONS

The present application is a national stage entry according to 35 U.S.C. §371 of PCT application No.: PCT/EP2013/057628 filed on Apr. 11, 2013, which claims priority from German application No.: 10 2012 206 967.4 filed on Apr. 26, 2012, and is incorporated herein by reference in its entirety.

TECHNICAL FIELD

In various embodiments, an optoelectronic component and a method for producing an optoelectronic component are provided.

BACKGROUND

An organic light emitting diode on a carrier includes an organic functional layer structure between a first electrode and a second electrode, wherein the first electrode is in contact with the carrier and an encapsulation layer can be deposited on or above the second electrode. A current flow between the electrodes leads to the generation of electromagnetic radiation in the organic functional layer system.

The organic constituents of organic components, for example organic optoelectronic components, for example an organic light emitting diode, are often susceptible with regard to UV radiation (electromagnetic radiation having a wavelength of less than approximately 400 nm) of daylight, since this radiation can lead to aging or degradation of the organic constituents, for example by means of the breaking of chemical bonds e.g. of C—O—O—H at 270-290 kJ/mol ($E_{380\ nm-400\ nm}$ approximately 290-305 kJ/mol) and/or cross-linking.

One conventional method for protecting organic optoelectronic components against UV radiation is to apply UV-radiation-absorbing (UV-absorbing) plastic films to the substrate glass or the transparent cover glass, depending on the light exit side.

With the applied UV-absorbing plastic film, the optoelectronic component has a plastic surface, instead of a glass surface. The merit of the appearance of the optoelectronic component can be reduced as a result.

Furthermore, conventional plastic films are more sensitive with regard to mechanical damage to the surface, for example scratches, than glass, which can have a disturbing effect on the optical system and the coupling-out of light.

Furthermore, by means of applying the UV-absorbing plastic film, for example by means of lamination, a further process step is required in the production of the optoelectronic component, as a result of which the process flow may be lengthened.

SUMMARY

In various embodiments, an optoelectronic component and a method for producing an optoelectronic component are provided with which it is possible to protect an optoelectronic component with a protective layer with regard to electromagnetic radiation having a wavelength of less than approximately 400 nm.

In the context of this description, an organic substance may be understood to mean a carbon compound which, regardless of the respective state of matter, is present in chemically uniform form and is characterized by characteristic physical and chemical properties. Furthermore, in the context of this description, an inorganic substance may be understood to mean a compound which, regardless of the respective state of matter, is present in chemically uniform form and is characterized by characteristic physical and chemical properties, without carbon or a simple carbon compound. In the context of this description, an organic-inorganic substance (hybrid substance) may be understood to mean a compound which, regardless of the respective state of matter, is present in chemically uniform form and is characterized by characteristic physical and chemical properties, including compound portions which contain carbon and are free of carbon. In the context of this description, the term "substance" encompasses all abovementioned substances, for example an organic substance, an inorganic substance, and/or a hybrid substance. Furthermore, in the context of this description, a substance mixture may be understood to mean something which has constituents consisting of two or more different substances, the constituents of which are very finely dispersed, for example. A substance class should be understood to mean a substance or a substance mixture including one or more organic substance(s), one or more inorganic substance(s) or one or more hybrid substance(s). The term "material" may be used synonymously with the term "substance".

In various embodiments, an optoelectronic component is provided, the optoelectronic component including: a carrier, a protective layer on or above the carrier, a first electrode on or above the protective layer, an organic functional layer structure on or above the first electrode, and a second electrode on or above the organic functional layer structure, wherein the protective layer has a lower transmission than the carrier for electromagnetic radiation having a wavelength of less than approximately 400 nm at least in one wavelength range; and wherein the protective layer includes a glass.

In one configuration, the carrier may be embodied in a planar fashion.

In another configuration, the carrier may include a soft glass or be formed therefrom.

In another configuration, the soft glass may be a soda-lime silicate glass.

Illustratively, therefore, a specific glass having a lower transmission than the carrier, for example of a carrier glass, with regard to electromagnetic radiation having a wavelength of less than approximately 400 nm at least in one wavelength range may be provided as a protective layer in various embodiments having a UV protection characteristic. As will be explained in even greater detail below, such a specific glass may also be provided with additional particles which likewise have UV-absorbing properties and additionally as scattering particles may scatter light in the visible wavelength range.

In another configuration, the protective layer may include or be formed from a layer of a molten glass solder powder on or above the carrier, wherein the molten glass solder layer has an intrinsically lower UV transmission than the carrier. By means of the lower UV transmission of the molten glass solder layer, it is possible in this case to form a UV protection for layers on or above the protective layer. The lower UV transmission of the molten glass solder of the protective layer relative to the carrier may be formed for example by means of a higher absorption and/or reflection of UV radiation.

In another configuration, the glass solder powder of the protective layer may include or be formed from a substance or substance mixture from the group of glass systems: PbO-containing systems: PbO—B$_2$O$_3$, PbO—SiO$_2$, PbO—B$_2$O$_3$—SiO$_2$, PbO—B$_2$O$_3$—ZnO$_2$, PbO—B$_2$O$_3$—Al$_2$O$_3$, wherein the PbO-containing glass solder may also include Bi$_2$O$_3$; Bi$_2$O$_3$-containing systems: Bi$_2$O$_3$—B$_2$O$_3$, Bi$_2$O$_3$—B$_2$O$_3$—SiO$_2$, Bi$_2$O$_3$—B$_2$O$_3$—ZnO, Bi$_2$O$_3$—B$_2$O$_3$ZnO—SiO$_2$.

In another configuration, the Bi-containing protective layer may additionally include a substance or a substance mixture from the group of substances: Al$_2$O$_3$, alkaline earth metal oxides, alkali metal oxides, ZrO$_2$, TiO$_2$, HfO$_2$, Nb$_2$O$_5$, Ta$_2$O$_5$, TeO$_2$, WO$_3$, MO$_3$, Sb$_2$O$_3$, Ag$_2$O, SnO$_2$, rare earth oxides.

In another configuration, the glass may be admixed with UV-absorbing compounds as glass components. By way of example, substances or substance mixtures including Ce, Fe, Sn, Ti, Pr, Eu, and/or V compounds may be added as glass batch constituents to glasses having a low melting point, for example lead-containing glasses, in order to increase the UV absorption, in the glass melt process. The UV-absorbing compounds may then be dissolved in the glass as constituents. After the glass melt process, the glass may be powdered and then applied to the carrier in the form of coatings. By means of a thermal treatment, vitrification of the glass solder powder which was modified by means of the compounds may form a molten glass solder layer having an intrinsically lower UV transmission. The glass modified with the compounds may be formed as a protective layer with intrinsic UV protection or as a substance mixture of the matrix of the protective layer, to which UV-absorbing additives and/or scattering additives may additionally be added.

In another configuration, the substance or the substance mixture of the glass solder powder of the protective layer may be liquefied at a temperature of up to a maximum of approximately 600° C.

In another configuration, the protective layer may include a matrix and embedded therein at least one first type of UV-absorbing additives, wherein the UV-absorbing additives reduce the transmission for electromagnetic radiation having a wavelength of less than approximately 400 nm at least in one wavelength range with respect to the matrix and/or the carrier. The lower UV transmission of the protective layer with additives with respect to the carrier and/or the matrix may be formed for example by means of a higher absorption and/or reflection and/or scattering of UV radiation by means of the UV-absorbing additives.

In another configuration, the matrix of the protective layer may have a refractive index of greater than approximately 1.7.

In another configuration, the matrix of the protective layer may be embodied in an amorphous fashion.

In another configuration, the matrix of the protective layer may include or may be formed from a substance or substance mixture from the group of glass systems: PbO-containing systems: PbO—B$_2$O$_3$, PbO—SiO$_2$, PbO—B$_2$O$_3$—SiO$_2$, PbO—B$_2$O$_3$—ZnO$_2$, PbO—B$_2$O$_3$—Al$_2$O$_3$, wherein the PbO-containing glass solder may also include Bi$_2$O$_3$; Bi$_2$O$_3$-containing systems: Bi$_2$O$_3$—B$_2$O$_3$, Bi$_2$O$_3$—B$_2$O$_3$—SiO$_2$, Bi$_2$O$_3$—B$_2$O$_3$—ZnO, Bi$_2$O$_3$—B$_2$O$_3$—ZnO—SiO$_2$.

In another configuration, the Bi-containing protective layer may additionally include a substance or a substance mixture from the group of substances: Al$_2$O$_3$, alkaline earth metal oxides, alkali metal oxides, ZrO$_2$, TiO$_2$, HfO$_2$, Nb$_2$O$_5$, Ta$_2$O$_5$, TeO$_2$, WO$_3$, MO$_3$, Sb$_2$O$_3$, Ag$_2$O, SnO$_2$, rare earth oxides.

In another configuration, the glass of the matrix may be admixed with UV-absorbing additives as glass components. By way of example, substances or substance mixtures including Ce, Fe, Sn, Ti, Pr, Eu, and/or V compounds may be added as glass batch constituents to glasses having a low melting point, for example lead-containing glasses, in order to increase the UV absorption, in the glass melt process.

In this case, a process of glass melting may be understood to mean thermal liquefying, i.e. melting, of a glass. The UV-absorbing additives may be dissolved in the glass as a constituent. After the glass melting process, the glass may be powdered, applied to a carrier in the form of coatings and subsequently vitrified by means of a thermal treatment.

In another configuration, the substance or the substance mixture of the matrix of the protective layer may be liquefied at a temperature of up to a maximum of approximately 600° C.

In another configuration, the UV-absorbing additives may include or be formed from an inorganic substance or an inorganic substance mixture.

In one configuration, the matrix may be admixed with at least one type of UV-absorbing additives.

In another configuration, one type of the UV-absorbing additives includes or is formed from a substance or substance mixture or a stoichiometric compound from the group of substances: TiO$_2$, CeO$_2$, Bi$_2$O$_3$, ZnO, SnO$_2$, phosphors: Ce$^{3+}$ doped garnets such as YAG:Ce and LuAG, Eu$^{3+}$ doped nitrides, sulfides, SIGNS, sialon, orthosilicates, chlorosilicates, chlorophosphates, BAM (barium magnesium aluminate:Eu) and/or SCAP, halophosphate, and UV-absorbing glass particles, suitable UV-absorbing metallic nanoparticles, wherein the phosphors exhibit absorption of electromagnetic radiation in the UV range.

By way of example, UV-absorbing nanoparticles may be added to glasses having a low melting point in order to increase the UV absorption. The UV-absorbing nanoparticles may have no or low solubility in the molten glass solder and/or may not react or react only poorly therewith. Furthermore, the nanoparticles may lead to no or only little scattering of electromagnetic radiation, for example nanoparticles having a grain size of less than approximately 50 nm, for example composed of TiO$_2$, CeO$_2$, ZnO or Bi$_2$O$_3$, wherein the nanoparticles should be dispersed very well in the glass.

In another configuration, one type of the UV-absorbing additives includes or is formed from a substance or substance mixture or a stoichiometric compound from the group of substances phosphors: by way of example Ce$^{3+}$ doped garnets such as YAG:Ce and LuAG, Eu$^{3+}$ doped nitrides, sulfides, SIGNS, sialon, orthosilicates, chlorosilicates, chlorophosphates, BAM (barium magnesium aluminate:Eu) and/or SCAP, halophosphate, and glass particles, wherein the phosphor or the glass exhibits absorption in the UV range.

In another configuration, the UV-absorbing additives may include particles which include or are formed from UV-absorbing glass.

The UV-absorbing particles may have an average grain size in a range of approximately 0.1 μm to approximately 10 μm, for example in a range of approximately 0.1 μm to approximately 1 μm.

In another configuration, the UV-absorbing additives on or above the carrier in the protective layer may have one ply having a thickness of approximately 5 nm to approximately 10 μm.

In another configuration, the UV-absorbing additives of the protective layer may have a plurality of plies one above another on the carrier, wherein the individual plies are embodied differently.

In another configuration, in the plies of UV-absorbing additives, the average particle size of at least one UV-absorbing additive may decrease from the surface of the carrier, wherein the UV-absorbing additives may also scatter visible light.

In another configuration, the individual plies of the UV-absorbing additives may have a different average particle size and/or a different transmission for electromagnetic radiation having a wavelength of less than approximately 400 nm at least in one wavelength range.

In another configuration, the protective layer including phosphors as UV-absorbing additives may be designed at the same time for wavelength conversion of electromagnetic radiation, wherein the phosphors have a stokes shift and emit incident electromagnetic radiation with a higher wavelength.

In another configuration, the matrix may include at least one type of scattering additives, such that the protective layer may additionally form a scattering effect with regard to incident electromagnetic radiation in at least one wavelength range, for example by means of a different refractive index than the matrix and/or a diameter corresponding approximately to the magnitude of the wavelength of the radiation to be scattered. In this case, the scattering effect may also concern electromagnetic radiation emitted by an organic functional layer system on or above the protective layer, for example in order to increase the coupling-out of light.

In another configuration, the light-scattering additives may additionally absorb UV radiation.

In another configuration, the protective layer including scattering additives may have a difference between the refractive index of the scattering additives and the refractive index of the matrix of greater than approximately 0.05.

In another configuration, the scattering additives may have a curved surface.

In another configuration, the geometrical shape of the scattering additives may have a geometrical shape and/or a part of a geometrical shape from the group of shapes: spherical, aspherical, for example prismatic, ellipsoid, hollow, compact, laminar or rod-shaped.

In one configuration, the scattering additives may be embodied as particles, wherein the scattering particles have an average grain size in a range of approximately 0.1 µm to approximately 10 µm, for example in a range of approximately 0.1 µm to approximately 1 µm.

In another configuration, the matrix of the protective layer may have a refractive index of greater than approximately 1.7.

In another configuration, the matrix of the protective layer may be embodied in an amorphous fashion.

In another configuration, the matrix of the protective layer may include or may be formed from a substance or substance mixture from the group of glass systems: PbO-containing systems: $PbO—B_2O_3$, $PbO—SiO_2$, $PbO—B_2O_3—SiO_2$, $PbO—B_2O_3—ZnO_2$, $PbO—B_2O_3—Al_2O_3$, wherein the PbO-containing glass solder may also include $Bi_2O_3$; $Bi_2O_3$-containing systems: $Bi_2O_3—B_2O_3$, $Bi_2O_3—B_2O_3—SiO_2$, $Bi_2O_3—B_2O_3—ZnO$, $Bi_2O_3—B_2O_3—ZnO—SiO_2$.

In another configuration, the Bi-containing protective layer may additionally include a substance or a substance mixture from the group of substances: $Al_2O_3$, alkaline earth metal oxides, alkali metal oxides, $ZrO_2$, $TiO_2$, $HfO_2$, $Nb_2O_5$, $Ta_2O_5$, $TeO_2$, $WO_3$, $MO_3$, $Sb_2O_3$, $Ag_2O$, $SnO_2$, rare earth oxides.

In one configuration, the glass of the matrix may be admixed with UV-absorbing additives as glass components. By way of example, substances or substance mixtures including Ce, Fe, Sn, Ti, Pr, Eu, and/or V compounds may be added as glass batch constituents to glasses having a low melting point, for example lead-containing glasses, in order to increase the UV absorption, in the glass melt process.

In this case, a process of glass melting may be understood to mean thermal liquefying, i.e. melting, of a glass. The UV-absorbing additives may be dissolved in the glass as a constituent. After the glass melting process, the glass may be powdered, applied to a carrier in the form of coatings and subsequently vitrified by means of a thermal treatment.

In another configuration, the substance or the substance mixture of the matrix of the protective layer may be liquefied at a temperature of up to a maximum of approximately 600° C.

In another configuration, the scattering additives may include or be formed from an inorganic substance or an inorganic substance mixture.

In another configuration, one type of the scattering additives may include or be formed from a substance or substance mixture or a stoichiometric compound from the group of substances: $TiO_2$, $CeO_2$, $Bi_2O_3$, $ZnO$, $Al_2O_3$, $SiO_2$, $Y_2O_3$ or $ZrO_2$.

In another configuration, the one type of scattering additives may additionally absorb UV radiation.

In another configuration, one type of the scattering additives may include or be formed from a substance or substance mixture or a stoichiometric compound from the group of phosphors: $Ce^{3+}$ doped garnets such as YAG:Ce and LuAG, $Eu^{3+}$ doped nitrides, sulfides, SIGNS, sialon, orthosilicates, chlorosilicates, chlorophosphates, BAM (barium magnesium aluminate:Eu) and/or SCAP, halophosphate.

In another configuration, the protective layer including phosphors as scattering additives may be designed at the same time for wavelength conversion of electromagnetic radiation, wherein the phosphors have a stokes shift and emit incident electromagnetic radiation with a higher wavelength.

In another configuration, the scattering additives may include or be formed from a glass.

In another configuration, the scattering additives on or above the carrier in the protective layer may have one ply having a thickness of approximately 5 nm to approximately 10 µm.

In another configuration, the scattering additives of the protective layer may have a plurality of plies one above another on the carrier, wherein the individual plies are formed differently.

In another configuration, in the plies of scattering additives, the average particle size of at least one scattering additive may decrease from the surface of the carrier.

In another configuration, the individual plies of the scattering additives may have a different average particle size and/or a different refractive index for electromagnetic radiation.

In another configuration, the material of the matrix may have an intrinsically lower UV transmission than the carrier. By means of the lower UV transmission of the matrix, it is possible to form UV protection for layers on or above the protective layer. The lower UV transmission of the matrix of the protective layer relative to the carrier may be formed for example by means of a higher absorption and/or reflection of UV radiation. In addition, it is also possible to add to the matrix scattering particles which, for example, do not absorb UV radiation, for example $Al_2O_3$, $SiO_2$, $Y_2O_3$ or $ZrO_2$. For the case where the UV transmission of the material of the matrix is still too high in relation to UV protection sought, UV-absorbing additives may also be added to the matrix, for example in addition to the non-UV-absorbing but scattering additives.

In another configuration, the scattering additives may also act or be designed as UV-absorbing additives, and the UV-absorbing additives may also act or be designed as scattering additives.

In another configuration, the protective layer including phosphors as UV-absorbing additives may be designed at the same time for wavelength conversion of electromagnetic radiation, wherein the phosphors have a stokes shift and emit incident electromagnetic radiation with a higher wavelength.

In another configuration, the protective layer may have an average refractive index greater than or approximately equal to the refractive index of further layers in the layer cross section.

In another configuration, the protective layer may have a thickness of at least approximately 1 µm to approximately 100 µm.

In another configuration, the protective layer may be embodied as a layer in a sectional plane of a light emitting diode.

In various embodiments, a method for producing an optoelectronic component is provided, the method including: forming a protective layer on or above a carrier; forming a first electrode on or above the protective layer; forming an organic functional layer structure on or above the first electrode; and forming a second electrode on or above the organic functional layer structure; wherein the protective layer is designed in such a way that the protective layer has a lower transmission of electromagnetic radiation than the carrier for electromagnetic radiation having a wavelength of less than approximately 400 nm at least in one wavelength range; and wherein the protective layer includes a glass.

In one configuration of the method, the carrier may be embodied in a planar fashion.

In another configuration of the method, the carrier may include a soft glass or be formed therefrom.

In another configuration of the method, the soft glass may be a soda-lime silicate glass.

In another configuration of the method, the protective layer may include or be formed from a layer of a molten glass solder powder on or above the carrier, wherein the molten glass solder layer has an intrinsically lower UV transmission than the carrier. By means of the lower UV transmission of the molten glass solder layer, it is possible in this case to form a UV protection for layers on or above the protective layer. The lower UV transmission of the molten glass solder of the protective layer relative to the carrier may be formed for example by means of a higher absorption and/or reflection of UV radiation.

In another configuration of the method, the glass solder powder of the protective layer may include or be formed from a substance or substance mixture from the group of glass systems: PbO-containing systems: $PbO-B_2O_3$, $PbO-SiO_2$, $PbO-B_2O_3-SiO_2$, $PbO-B_2O_3-ZnO_2$, $PbO-B_2O_3-Al_2O_3$, wherein the PbO-containing glass solder may also include $Bi_2O_3$; $Bi_2O_3$-containing systems: $Bi_2O_3-B_2O_3$, $Bi_2O_3-B_2O_3-SiO_2$, $Bi_2O_3-B_2O_3-ZnO$, $Bi_2O_3-B_2O_3-ZnO-SiO_2$.

In another configuration, the Bi-containing protective layer may additionally include a substance or a substance mixture from the group of substances: $Al_2O_3$, alkaline earth metal oxides, alkali metal oxides, $ZrO_2$, $TiO_2$, $HfO_2$, $Nb_2O_5$, $Ta_2O_5$, $TeO_2$, $WO_3$, $MO_3$, $Sb_2O_3$, $Ag_2O$, $SnO_2$, rare earth oxides.

In another configuration of the method, the glass may be admixed with UV-absorbing additives as glass components. By way of example, substances or substance mixtures including Ce, Fe, Sn, Ti, Pr, Eu, and/or V compounds may be added as glass batch constituents to glasses having a low melting point, for example lead-containing glasses, in order to increase the UV absorption, in the glass melt process.

In this case, the glass melting process may be understood to mean thermal liquefying, i.e. melting, of a glass. The UV-absorbing additives may then be dissolved in the glass as constituents. After the glass melting process, the glass may be powdered, applied to a carrier in the form of coatings and subsequently vitrified by means of a thermal treatment.

In another configuration of the method, the substance or the substance mixture of the glass solder powder of the protective layer may be liquefied at a temperature of up to a maximum of approximately 600° C.

In another configuration of the method, the protective layer may include a matrix and embedded therein at least one first type of UV-absorbing additives, wherein the UV-absorbing additives reduce the transmission for electromagnetic radiation having a wavelength of less than approximately 400 nm at least in one wavelength range with respect to the matrix and/or the carrier. The lower UV transmission of the protective layer with additives with respect to the carrier and/or the matrix may be formed for example by means of a higher absorption and/or reflection and/or scattering of UV radiation by means of the UV-absorbing additives.

In another configuration of the method, the matrix of the protective layer may have a refractive index of greater than approximately 1.7.

In another configuration of the method, the matrix of the protective layer may be embodied in an amorphous fashion.

In another configuration of the method, the matrix of the protective layer may include or may be formed from a substance or substance mixture from the group of glass systems: PbO-containing systems: $PbO-B_2O_3$, $PbO-SiO_2$, $PbO-B_2O_3-O_2$, $PbO-B_2O_3O_2$, $PbO-B_2O_3Al_2O_3$, wherein the PbO-containing glass solder may also include $Bi_2O_3$; $Bi_2O_3$-containing systems: $Bi_2O_3-B_2O_3$, $Bi_2O_3-B_2O_3-SiO_2$, $Bi_2O_3-B_2O_3-ZnO$, $Bi_2O_3-B_2O_3-ZnO-SiO_2$.

In another configuration of the method, the Bi-containing protective layer may additionally include a substance or a substance mixture from the group of substances: $Al_2O_3$, alkaline earth metal oxides, alkali metal oxides, $ZrO_2$, $TiO_2$, $HfO_2$, $Nb_2O_5$, $Ta_2O_5$, $TeO_2$, $WO_3$, $MO_3$, $Sb_2O_3$, $Ag_2O$, $SnO_2$, rare earth oxides.

In another configuration of the method, the glass of the matrix may be admixed with UV-absorbing additives as glass components. By way of example, substances or substance mixtures including Ce, Fe, Sn, Ti, Pr, Eu, and/or V compounds may be added as glass batch constituents to glasses having a low melting point, for example lead-containing glasses, in order to increase the UV absorption, in the glass melt process. In this case, a process of glass melting may be understood to mean thermal liquefying, i.e. melting, of a glass. The UV-absorbing additives may be dissolved in the glass as a constituent. After the glass melting process, the glass may be powdered, applied to a carrier in the form of coatings and subsequently vitrified by means of a thermal treatment.

In another configuration of the method, the substance or the substance mixture of the matrix of the protective layer may be liquefied at a temperature of up to a maximum of approximately 600° C.

In another configuration of the method, UV-absorbing additives may include or be formed from an inorganic substance or an inorganic substance mixture.

Instead of the added compounds or in addition, UV-absorbing nanoparticles may be added to glasses having a low melting point in order to increase the UV absorption. The UV-absorbing nanoparticles may have no or low solubility in the molten glass solder and/or may not react or react only poorly therewith. Furthermore, the nanoparticles may lead to no or only little scattering of electromagnetic radiation, for example visible electromagnetic radiation, for example nanoparticles having a grain size of less than approximately 50 nm, for example composed of $TiO_2$, $CeO_2$, ZnO or $Bi_2O_3$, wherein the nanoparticles should be dispersed very well in the glass.

In another configuration of the method, one type of the UV-absorbing additives includes or is formed from a substance or substance mixture or a stoichiometric compound from the group of substances phosphors: $Ce^{3+}$ doped garnets such as YAG:Ce and LuAG, $Eu^{3+}$ doped nitrides, sulfides, SIGNS, sialon, orthosilicates, chlorosilicates, chlorophosphates, BAM (barium magnesium aluminate:Eu) and/or SCAP, halophosphate, and glass particles, wherein the phosphor exhibits absorption in the UV range.

In another configuration of the method, the UV-absorbing additives may include particles which include or are formed from UV-absorbing glass.

In another configuration of the method, the UV-absorbing particles may have an average grain size in a range of approximately 0.1 µm to approximately 10 µm, for example in a range of approximately 0.1 µm to approximately 1 µm.

In another configuration of the method, one type of the UV-absorbing additives may include or be formed from a substance or substance mixture or a stoichiometric compound from the group of substances: $TiO_2$, $CeO_2$, $Bi_2O_3$, $Y_2O_3$, $ZrO_2$, $SiO_2$, $Al_2O_3$, ZnO, $SnO_2$, phosphors: by way of example $Ce^{3+}$ doped garnets such as YAG:Ce and LuAG, $Eu^{3+}$ doped nitrides, sulfides, SIGNS, sialon, orthosilicates, chlorosilicates, chlorophosphates, BAM (barium magnesium aluminate:Eu) and/or SCAP, halophosphate, glass particles, metallic nanoparticles, wherein the phosphor may exhibit absorption in the UV range.

In another configuration of the method, the UV-absorbing additives on or above the carrier in the protective layer may be embodied as one ply having a thickness of approximately 5 nm to approximately 10 µm.

In another configuration of the method, a plurality of plies of UV-absorbing additives may be embodied one above another on the carrier, wherein the individual plies are embodied differently.

In another configuration of the method, the plies of UV-absorbing additives may be embodied such that the average particle size of at least one UV-absorbing additive decreases from the surface of the carrier.

In another configuration of the method, the individual plies of the UV-absorbing additives may be embodied such that the UV-absorbing additives have a different average particle size and/or a different transmission for electromagnetic radiation having a wavelength of less than approximately 400 nm at least in one wavelength range.

In another configuration of the method, the protective layer including phosphors as UV-absorbing additives may be designed at the same time for wavelength conversion of electromagnetic radiation, wherein the phosphors have a stokes shift and emit incident electromagnetic radiation with a higher wavelength.

In another configuration of the method, the matrix may include at least one type of scattering additives, such that the protective layer may simultaneously form a scattering effect with regard to incident electromagnetic radiation in at least one wavelength range, for example by means of a different refractive index than the matrix and/or a diameter corresponding approximately to the magnitude of the wavelength of the radiation to be scattered. In this case, the scattering effect may also concern electromagnetic radiation emitted by an organic functional layer system on or above the protective layer, for example in order to increase the coupling-out of light.

In another configuration of the method, at least one scattering additive may have a difference between the refractive index and the refractive index of the matrix of greater than approximately 0.05.

In another configuration of the method, the scattering additives may have a curved surface.

In another configuration of the method, the geometrical shape of the scattering additives may have a geometrical shape and/or a part of a geometrical shape from the group of shapes: spherical, aspherical, for example prismatic, ellipsoid, hollow, compact.

In one configuration of the method, the scattering additives may be embodied as particles, wherein the scattering particles have an average grain size in a range of approximately 0.1 µm to approximately 10 µm, for example in a range of approximately 0.1 µm to approximately 1 µm.

In another configuration of the method, the matrix of the protective layer, after the solidification of the protective layer, may have a refractive index of greater than approximately 1.7.

In another configuration of the method, the matrix of the protective layer may be embodied in an amorphous fashion.

In another configuration of the method, the matrix of the protective layer may include or may be formed from a substance or substance mixture from the group of glass systems: PbO-containing systems: PbO—$B_2O_3$, PbO—$SiO_2$, PbO—$B_2O_3$—$SiO_2$, PbO—$B_2O_3$—$ZnO_2$, PbO—$B_2O_3Al_2O_3$, wherein the PbO-containing glass solder may also include $Bi_2O_3$; $Bi_2O_3$-containing systems: $Bi_2O_3$—$B_2O_3$, $Bi_2O_3$—$B_2O_3$—$SiO_2$, $Bi_2O_3$—$B_2O_3$—ZnO, $Bi_2O_3$—$B_2O_3$—ZnO—$SiO_2$.

In another configuration of the method, the Bi-containing protective layer may additionally include a substance or a substance mixture from the group of substances: $Al_2O_3$, alkaline earth metal oxides, alkali metal oxides, $ZrO_2$, $TiO_2$, $HfO_2$, $Nb_2O_5$, $Ta_2O_5$, $TeO_2$, $WO_3$, $MO_3$, $Sb_2O_3$, $Ag_2O$, $SnO_2$, rare earth oxides.

In another configuration of the method, the glass of the matrix may be admixed with UV-absorbing additives as glass components. By way of example, substances or substance mixtures including Ce, Fe, Sn, Ti, Pr, Eu, and/or V compounds may be added as glass batch constituents to glasses having a low melting point, for example lead-containing glasses, in order to increase the UV absorption, in the glass melt process.

In this case, a process of glass melting may be understood to mean thermal liquefying, i.e. melting, of a glass. The UV-absorbing additives may be dissolved in the glass as a constituent. After the glass melting process, the glass may be powdered, applied to a carrier in the form of coatings and subsequently vitrified by means of a thermal treatment.

In another configuration of the method, the substance or the substance mixture of the matrix of the protective layer may be liquefied at a temperature of up to a maximum of approximately 600° C.

In another configuration of the method, the scattering additives may include or be formed from an inorganic substance or an inorganic substance mixture.

In another configuration of the method, one type of the scattering additives may include or be formed from a substance or substance mixture or a stoichiometric compound from the group of substances: $TiO_2$, $CeO_2$, $Bi_2O_3$, $ZnO$.

In another configuration of the method, one type of the scattering additives may include or be formed from a substance or substance mixture or a stoichiometric compound from the group of phosphors: by way of example $Ce^{3+}$ doped garnets such as YAG:Ce and LuAG, $Eu^{3+}$ doped nitrides, sulfides, SIGNS, sialon, orthosilicates, chlorosilicates, chlorophosphates, BAM (barium magnesium aluminate:Eu) and/or SCAP, halophosphate.

In another configuration of the method, the protective layer including phosphors as scattering additives may be designed at the same time for wavelength conversion of electromagnetic radiation, wherein the phosphors have a stokes shift and emit incident electromagnetic radiation with a higher wavelength.

In another configuration of the method, the scattering additives may include or be formed from a UV-absorbing glass, wherein the glass may be embodied as UV-absorbing.

In another configuration of the method, the scattering additives may be formed on or above the carrier in the protective layer in such a way that the scattering additives form one ply having a thickness of approximately 5 nm to approximately 10 μm.

In another configuration of the method, a plurality of plies of scattering additives may be formed one above another on the carrier, wherein the individual plies are formed differently.

In another configuration of the method, the plies of scattering additives may be embodied in such a way that the average particle size of at least one scattering additive decreases from the surface of the carrier.

In another configuration of the method, the individual plies of the scattering additives may have a different average particle size and/or a different refractive index for electromagnetic radiation.

In another configuration of the method, the material of the matrix may have an intrinsically lower UV transmission than the carrier. By means of the lower UV transmission of the matrix, it is possible to form UV protection for layers on or above the protective layer. The lower UV transmission of the matrix of the protective layer relative to the carrier may be formed for example by means of a higher absorption and/or reflection of UV radiation. For the case where the UV transmission of the material of the matrix is still too high in relation to UV protection sought, UV-absorbing additives may also be added to the matrix, for example in addition to the non-UV-absorbing but scattering additives, for example including $Al_2O_3$, $SiO_2$, $Y_2O_3$ or $ZrO_2$. The UV-absorbing additives may also act or be designed as scattering additives.

In another configuration of the method, the UV-absorbing additives and/or scattering additives may be formed on or above the carrier and the glass solder powder may be formed on or above the ply of the UV-absorbing additives and/or scattering additives, and the glass may be liquefied in such a way that one part of the liquefied glass flows between the particles of the UV-absorbing additives and/or of the scattering additives toward the surface of the carrier in such a way that another part of the liquefied glass remains above the added particles.

In this case, the part of the protective layer above the added particles should have a thickness greater than or equal to the roughness of the topmost ply of the scattering centers without glass, such that at least one smooth surface is formed, i.e. the surface has a low RMS roughness (root mean square—magnitude of the mean deviation), for example less than 10 nm. The roughness of the topmost ply of the added particles is dependent on the actual size of the added particles, i.e. not just the average particle size, and the concentration of the added particles in the plane parallel to the carrier.

What is essential to the method is the liquefying of the glass after the added particles have been applied. It is thereby possible to set the distribution of the added particles in the UV-absorbing protective layer and to form a smooth surface of the UV-absorbing protective layer in a single glass liquefying process, for example tempering process. The production of a suspension or paste composed of glass particles or including a glass powder should not be understood as liquefying in this sense, since the appearance of the glass particles is not altered by the suspension.

In a further configuration of the method, the glass powder may be mixed with scattering additives and/or UV-absorbing additives and may be applied to the carrier as a paste or suspension by means of screen or stencil printing. After vitrification this may lead to a homogeneous distribution of the additives in the glass matrix.

In another configuration of the method, a carrier composed of soda-lime silicate glass is used in combination with a glass powder which may be vitrified at temperatures of up to a maximum of 600° C., that is to say that the glass powder softens to an extent such that it runs smoothly.

In another configuration of the method, the glass may be formed as glass powder and vitrified at a temperature of up to a maximum of approximately 600° C., i.e. the glass powder softens in such a way that it may form a smooth surface. The substance or the substance mixture of the carrier, for example soda-lime silicate glass, should be thermally stable at the vitrification temperature of the glass powder, i.e. have an unchanged layer cross section.

In another configuration of the method, the UV-absorbing particles added may be formed from a suspension, or paste, containing the particles added, onto or above the carrier.

Methods for producing layers from suspensions or pastes may be, for example, screen printing, stencil printing, blade coating, or spraying methods.

In another configuration of the method, the suspension or paste containing the particles added may include liquid evaporative and/or organic constituents in addition to the particles added. These constituents may be different additives, for example solvents, binders, for example cellulose, cellulose derivatives, nitrocellulose, cellulose acetate, acrylates, and may be added to the added particles or glass particles in order to set the viscosity for the respective method and for the layer thickness respectively sought.

Organic additives, which may usually be liquid and/or volatile, may be removed thermally from the layer, i.e. the layer may be thermally dried. Nonvolatile organic additives may be removed by means of pyrolysis. In this case, increasing the temperature may accelerate or enable the drying or the pyrolysis.

In another configuration of the method, the glass particle suspension or glass particle paste may include liquid evaporative and/or organic components, for example binders, in addition to the glass particles or glass powder.

In another configuration of the method, the glass particle suspension or glass particle paste and the suspension or paste containing the particles added may include liquid evaporative and/or organic components that are miscible with one another. It is thereby possible to prevent a phase separation or precipitation of additives within the dried suspension or paste containing the particles added, or the dried glass layer suspension or paste containing the particles added.

In another configuration of the method, the glass particle suspension or paste containing the particles added, on or above the particles added, may be dried by means of evaporative constituents.

In another configuration of the method, by means of increasing the temperature it is possible for the organic constituents (binders) to be substantially completely removed from the dried particle layer and from the dried glass powder layer.

In another configuration of the method, by means of increasing the temperature to a second value, wherein the second temperature is very much greater than the first temperature of the drying, it is possible for the glass or glass powder to be softened in such a way that it may flow, for example becomes liquid.

The maximum magnitude of the second temperature value for liquefying or vitrifying the glass powder layer may be dependent on the carrier. The temperature regime (temperature and time) may be chosen in such a way that the carrier is not deformed, but the glass solder of the glass powder layer may already have a viscosity such that it may run smoothly, i.e. flow, and a very smooth vitreous surface may be formed.

The glass of the glass powder layer may have a second temperature, i.e. the vitrification temperature, for example below the transformation point of the carrier, for example of the carrier glass (viscosity of the carrier $\eta=10^{14.5}$ dPa·s), and maximally at the softening temperature (viscosity of the carrier $\eta=10^{7.6}$ dPa·s) of the carrier glass, for example below the softening temperature and approximately at the upper cooling point (viscosity of the carrier $\eta=10^{13.0}$ dPa·s).

In another configuration of the method, the glass powder, with the use of a soda-lime silicate glass as carrier, may be vitrified at temperatures of up to a maximum of approximately 600° C.

In another configuration of the method, by means of liquefied glass between the UV-absorbing particles, it is possible to form at least one uninterrupted continuous glass connection of the carrier to the liquefied glass above the UV-absorbing particles.

In another configuration of the method, the carrier may include a soda-lime silicate glass or be formed therefrom, wherein the temperature for vitrifying the glass powder or the glass powder layer should maximally be a value of approximately 600° C.

In another configuration of the method, the surface of the liquefied glass above the UV-absorbing particle layer, after solidification, may be additionally smoothed again by means of local heating.

In another configuration of the method, the local heating may be formed by means of plasma or laser radiation.

In another configuration of the method, the protective layer may be embodied as a layer in a sectional plane of a light emitting diode.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the accompanying drawings, which form part of this description and show for illustration purposes specific embodiments in which the disclosure can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present disclosure. It goes without saying that the features of the various embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

Figure 1:
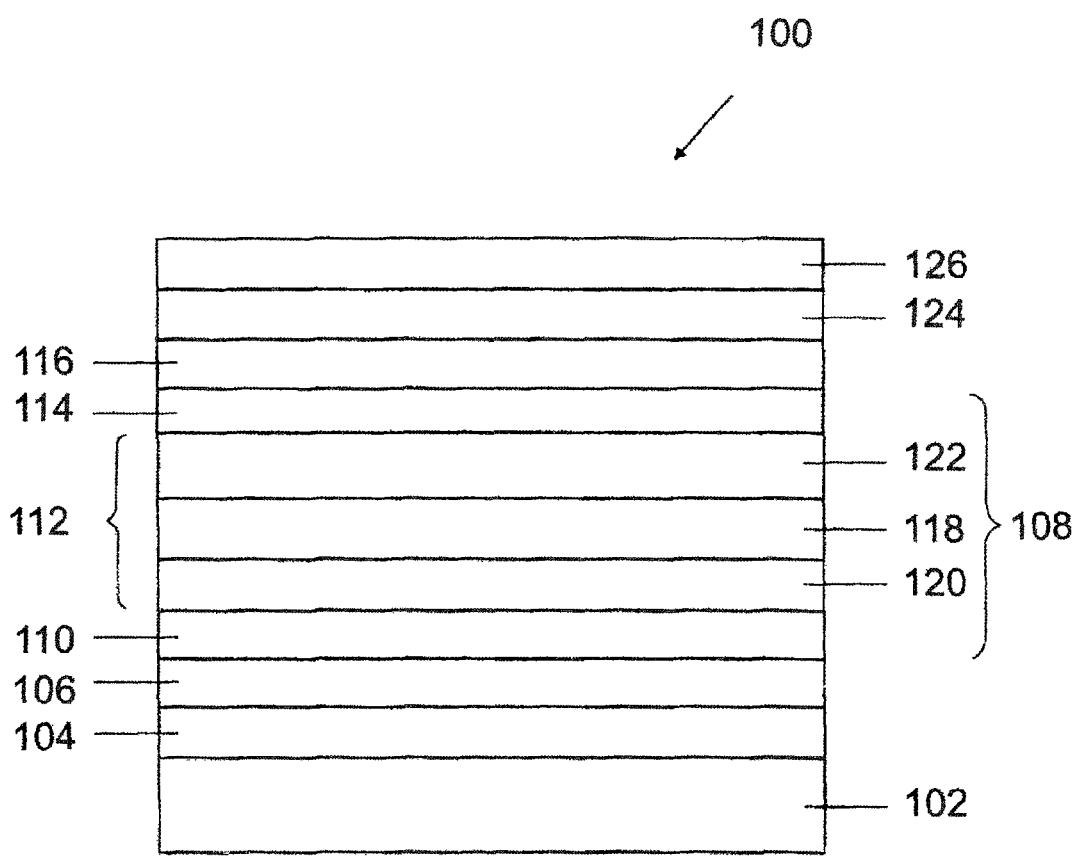
FIG. 1 shows a schematic cross-sectional view of an organic light emitting diode in accordance with various embodiments.

FIG. 1 shows a schematic cross-sectional view of an organic light emitting diode 100 in accordance with various embodiments.

The light emitting component 100 in the form of an organic light emitting diode 100 may have a carrier 102. The carrier 102 may serve for example as a carrier element for electronic elements or layers, for example light emitting elements. By way of example, the carrier 102 may be a glass (soft glass or hard glass, preferably soft glass), or a quartz glass. Furthermore, the carrier 102 may be a plastic film or a laminate including one or including a plurality of plastic films. The carrier 102 may be embodied as translucent or even transparent.

In various embodiments, the term "translucent" or "translucent layer" may be understood to mean that a layer is transmissive to light, for example to the light generated by the light emitting component, for example in one or more wavelength ranges, for example to light in a wavelength range of visible light (for example at least in a partial range of the wavelength range of from 380 nm to 780 nm). By way of example, in various embodiments, the term "translucent layer" should be understood to mean that substantially the entire quantity of light coupled into a structure (for example a layer) is also coupled out from the structure (for example layer), wherein part of the light may be scattered in this case.

In various embodiments, the term "transparent" or "transparent layer" may be understood to mean that a layer is transmissive to light (for example at least in a partial range of the wavelength range of from 380 nm to 780 nm), wherein light coupled into a structure (for example a layer) is also coupled out from the structure (for example layer) substantially without scattering or light conversion. Consequently, in various embodiments, "transparent" should be regarded as a special case of "translucent".

For the case where, for example, a light emitting monochromatic or emission spectrum-limited electronic component is intended to be provided, it suffices for the optically translucent layer structure to be translucent at least in a partial range of the wavelength range of the desired monochromatic light or for the limited emission spectrum.

In various embodiments, the organic light emitting diode 100 (or else the light emitting components in accordance with the embodiments that have been described above or will be described below) may be designed as a so-called top and bottom emitter. A top and bottom emitter may also be designated as an optically transparent component, for example a transparent organic light emitting diode.

In various embodiments, a barrier layer 104 may optionally be arranged on or above the carrier 102. The barrier layer 104 may include or consist of one or more of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. Furthermore, in various embodiments, the barrier layer 104 may have a layer thickness in a range of approximately 0.1 nm (one atomic layer) to approximately 5000 nm, for example a layer thickness in a range of approximately 10 nm to approximately 200 nm, for example a layer thickness of approximately 40 nm.

In this regard, in various embodiments, the protective layer 106 may be formed on or above the barrier layer 104 (or, if the barrier layer 104 is not present, on or above the carrier 102).

The protective layer 106 absorbs the UV radiation that is harmful to the organic functional layer structure 112. This may be realized by means of the composition of the substance or substance mixture of the protective layer 106, for example of the glass, or by means of the addition of particles which absorb or reflect UV radiation.

In order to increase the coupling-out of light and thus the coupling-out efficiency of the component 100, the protective layer 106 may include a high refractive index glass (high index) having a refractive index of greater than approximately 1.7 and distributed UV-absorbing scattering centers, for example UV-absorbing scattering particles.

However, the refractive index of the protective layer 106 should be optically matched to the layer-thickness-weighted mean value of the refractive indices of the organic functional layer structure 112 and the transparent electrodes 110, 114.

A layer-thickness-weighted refractive index is a mean value of the refractive indices of the individual layers weighted with the respective layer thickness portions.

In one configuration, the protective layer 106 may have a refractive index similar to that of the first electrode 110 and the organic functional layer structure 112 and greater than approximately 1.7.

The surface of the protective layer 106 should have a low surface roughness (root mean square roughness RMS), i.e. should be very smooth, for example in a range of approximately 0.1 nm to approximately 10 nm. Spikes, i.e. discontinuities on the surface having a high aspect ratio and a height of a few 10 nm, should be prevented since they may lead to problems in the encapsulation and leakage currents during the operation of the optoelectronic component.

In the manufacture of the optoelectronic component, spikes may give rise to an abrupt decrosslinking of the organic layers in the vicinity of the spikes. In the case of a small total thickness of the electrically active region 108 and the multiplicity of method steps for forming the electrically active region 108, by means of the spikes the second electrode 114 may be formed in physical contact with the first electrode 110, that is to say that a short circuit may occur.

Furthermore, the thin-film encapsulation 116, in the case of a layer thickness of a few 10 nm, may decrosslinked by means of the spikes of the protective layer 106 underlying layers, for example the second electrode 114, in the vicinity of the spikes. As a result, the organic optoelectronic component 100 may no longer be sufficiently protected against external influences, for example indiffusion of chemical substances, for example water and/or oxygen.

In order to avoid spikes of the substrates 102 which could penetrate through the electrically active region 108, polished glass substrates 102 may be used as the carrier 102.

In order to avoid alkali diffusion possibly originating from the substrate glass 102, the substrate 102 may be formed with an $SiO_2$ barrier layer 104.

If an alkali-free or low-alkali glass solder is used for the protective layer 106, a barrier layer 104 may not need to be applied.

In one configuration, the protective layer 106 may include high refractive index glasses and/or glass solders having a low melting point. Among the glasses having a low melting point, $Bi_2O_3$-containing substance mixtures may have a good absorption of UV radiation and a high refractive index (greater than approximately 1.7), for example:

$Bi_2O_3$—$B_2O_3$,
$Bi_2O_3$—$B_2O_3$—$SiO_2$,
$Bi_2O_3$—$B_2O_3$—$ZnO$,
$Bi_2O_3$—$B_2O_3$—$ZnO$—$SiO_2$.

The $Bi_2O_3$-containing systems may also include further glass components, for example $Al_2O_3$, alkaline earth metal oxides, alkali metal oxides, $ZrO_2$, $TiO_2$, $HfO_2$, $Nb_2O_5$, $Ta_2O_5$, $TeO_2$, $WO_3$, $MO_3$, $Sb_2O_3$, $Ag_2O$, $SnO_2$, and rare earth oxides.

A good absorption of UV radiation by a layer may be understood to mean a transmission of electromagnetic radiation having a wavelength of less than approximately 350 nm through said layer to a maximum of approximately 5%, and with a wavelength of less than approximately 380 nm to a maximum of approximately 20%, preferably a maximum of approximately 10%. Below approximately 340 nm, approximately 100% of the UV radiation is absorbed or reflected by means of the protective layer.

In one configuration of the optoelectronic component, the glass of the protective layer 106 may also include or be formed from a glass solder from the group of PbO-containing glass systems: for example of:

PbO—$B_2O_3$,
PbO—$SiO_2$,
PbO—$B_2O_3$—$SiO_2$,
PbO—$B_2O_3$—$ZnO_2$,
PbO—$B_2O_3$—$Al_2O_3$, wherein the PbO-containing glass solder may also include $Bi_2O_3$.

In one configuration, the glass of the matrix may be admixed with UV-absorbing compounds as glass components. By way of example, substances or substance mixtures including Ce, Fe, Sn, Ti, Pr, Eu, and/or V compounds may be added as glass batch constituents to glasses having a low melting point, for example lead-containing glasses, in order to increase the UV absorption, in the glass melt process.

In this case, a process of glass melting may be understood to mean thermal liquefying, i.e. melting, of a glass. The UV-absorbing additives may be dissolved in the glass as a constituent. After the glass melting process, the glass may be powdered, applied to a carrier in the form of coatings and subsequently vitrified by means of a thermal treatment.

The substance or the substance mixture of the protective layer may be formed for example as pastes onto the carrier 102. The pastes may include a glass powder, a binder and/or a solvent. The paste may be applied to the carrier 102 for example by means of screen printing, stencil printing or a spraying method.

By means of a thermal treatment, i.e. by means of increasing the temperature, of the pastes applied to the carrier 102, liquefying, for example vitrification, may be effected and the protective layer 106 may be formed.

In another configuration, the carrier 102 may include a soda-lime silicate glass and have the vitrification temperature of the paste of the protective layer in a range of approximately 400° C. to approximately 600° C., for example below the transformation point of the carrier 102, in order that warping or deformation of the carrier 102 is avoided or kept small. Increasing the temperature may be realized for example by means of a furnace, laser sintering or in situ by means of a thermal spraying process.

However, the PbO-containing glasses may have an insufficient UV absorption, with the result that a targeted modification of the glasses may be necessary, for example by means of the addition of UV-absorbing additives, for example chemical compounds, in the glass melt of the PbO-containing glasses and/or by means of the addition of UV-absorbing nanoparticles which have no or little solubility in the glass solder and/or react chemically with it and/or lead to no significant scattering.

In various embodiments, the protective layer 106 may have a thickness of approximately 1 μm to approximately 50 μm,
for example approximately 1 μm to approximately 40 μm,
for example 3 μm to approximately 30 μm,
for example 5 μm to approximately 20 μm.

Further specifications of the protective layer 106 may be gathered from the description of FIG. 2-FIG. 14.

In this regard, in various embodiments, the first electrode 110 (for example in the form of a first electrode layer 110) may be applied on or above the protective layer 106. The first electrode 110 (also designated hereinafter as bottom electrode 110) may be formed from an electrically conductive material, such as, for example, a metal or a transparent conductive oxide (TCO) or a layer stack including a plurality of layers of the same metal or different metals and/or the same TCO or different TCOs. Transparent conductive oxides are transparent conductive materials, for example metal oxides, such as, for example, zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_2$, $ZnSnO_2$, $MgIn_2O_4$, $GaInO_2$, $Zn_2In_2O_5$ or $In_4Sn_3O_{12}$, or mixtures of different transparent conductive oxides also belong to the group of TCOs and may be used in various embodiments. Furthermore, the TCOs do not necessarily correspond to a stoichiometric composition and may furthermore be p-doped or n-doped.

In various embodiments, the first electrode 110 may include a metal; for example Ag, Pt, Au, Mg, Al, Ba, In, Ag, Au, Mg, Ca, Sm or Li, and compounds, combinations or alloys of these materials.

In various embodiments, the first electrode 110 may be formed by a layer stack of a combination of a layer of a metal on a layer of a TCO, or vice versa. One example is a silver layer applied on an indium tin oxide layer (ITO) (Ag on ITO) or ITO—Ag—ITO multilayers.

In various embodiments, the first electrode 110 may provide one or a plurality of the following materials as an alternative or in addition to the abovementioned materials: networks composed of metallic nanowires and nanoparticles, for example composed of Ag; networks composed of carbon nanotubes; graphene particles and graphene layers; networks composed of semiconducting nanowires.

Furthermore, the first electrode 110 may include electrically conductive polymers or transition metal oxides or transparent electrically conductive oxides.

In various embodiments, the first electrode 110 and the carrier 102 may be formed as translucent or transparent. In the case where the first electrode 110 is formed from a metal, the first electrode 110 may have for example a layer thickness of less than or equal to approximately 25 nm, for example a layer thickness of less than or equal to approximately 20 nm, for example a layer thickness of less than or equal to approximately 18 nm. Furthermore, the first electrode 110 may have for example a layer thickness of greater than or equal to approximately 10 nm, for example a layer thickness of greater than or equal to approximately 15 nm. In various embodiments, the first electrode 110 may have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

Furthermore, for the case where the first electrode 110 is formed from a transparent conductive oxide (TCO), the first electrode 110 may have for example a layer thickness in a range of approximately 50 nm to approximately 500 nm, for example a layer thickness in a range of approximately 75 nm to approximately 250 nm, for example a layer thickness in a range of approximately 100 nm to approximately 150 nm.

Furthermore, for the case where the first electrode 110 is formed from, for example, a network composed of metallic nanowires, for example composed of Ag, which may be combined with conductive polymers, a network composed of carbon nanotubes which may be combined with conductive polymers, or from graphene layers and composites, the first electrode 110 may have for example a layer thickness in a range of approximately 1 nm to approximately 500 nm, for example a layer thickness in a range of approximately 10 nm to approximately 400 nm, for example a layer thickness in a range of approximately 40 nm to approximately 250 nm.

The first electrode 110 may be formed as an anode, that is to say as a hole-injecting electrode, or as a cathode, that is to say as an electron-injecting electrode.

The first electrode 110 may have a first electrical terminal, to which a first electrical potential (provided by an energy source (not illustrated), for example a current source or a voltage source) may be applied. Alternatively, the first electrical potential may be applied to the carrier 102 and then be fed indirectly to the first electrode 110 via said carrier. The first electrical potential may be, for example, the ground potential or some other predefined reference potential.

Furthermore, the electrically active region 108 of the light emitting component 100 may have an organic electroluminescent layer structure 112 or organic functional layer structure 112, which is applied on or above the first electrode 110.

The organic electroluminescent layer structure 112 may include one or a plurality of emitter layers 118, for example including fluorescent and/or phosphorescent emitters, and one or a plurality of hole-conducting layers 120 (also designated as hole transport layer(s) 120). In various embodiments, one or a plurality of electron-conducting layers 122 (also designated as electron transport layer(s) 122) may alternatively or additionally be provided.

Examples of emitter materials which may be used in the light emitting component 100 in accordance with various embodiments for the emitter layer(s) 118 include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl) iridium III), green phosphorescent Ir(ppy)$_3$ (tris(2-phenylpyridine)iridium III), red phosphorescent Ru (dtb-bpy)$_3$*2(PF$_6$) (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters. Such non-polymeric emitters may be deposited by means of thermal evaporation, for example. Furthermore, it is possible to use polymer emitters, which may be deposited, in particular, by means of a wet-chemical method such as spin coating, for example.

The emitter materials may be embedded in a matrix material in a suitable manner.

It should be pointed out that other suitable emitter materials are likewise provided in other embodiments.

The emitter materials of the emitter layer(s) 118 of the light emitting component 100 may be selected for example such that the light emitting component 100 emits white light. The emitter layer(s) 118 may include a plurality of emitter materials that emit in different colors (for example blue and yellow or blue, green and red); alternatively, the emitter layer(s) 118 may also be constructed from a plurality of partial layers, such as a blue fluorescent emitter layer 118 or blue phosphorescent emitter layer 118, a green phosphorescent emitter layer 118 and a red phosphorescent emitter layer 118. By mixing the different colors, the emission of light having a white color impression may result. Alternatively, provision may also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary and secondary radiation.

The organic electroluminescent layer structure 112 may generally include one or a plurality of electroluminescent layers. The one or the plurality of electroluminescent layers may include organic polymers, organic oligomers, organic monomers, organic small, non-polymeric molecules ("small molecules") or a combination of these materials. By way of example, the organic electroluminescent layer structure 112 may include one or a plurality of electroluminescent layers embodied as a hole transport layer 120, so as to enable for example in the case of an OLED an effective hole injection into an electroluminescent layer or an electroluminescent region. Alternatively, in various embodiments, the organic electroluminescent layer structure 112 may include one or a plurality of functional layers embodied as an electron transport layer 122, so as to enable for example in an OLED an effective electron injection into an electroluminescent layer or an electroluminescent region. By way of example, tertiary amines, carbazo derivatives, conductive polyaniline or polyethylene dioxythiophene may be used as material for the hole transport layer 120. In various embodiments, the one or the plurality of electroluminescent layers may be embodied as an electroluminescent layer.

In various embodiments, the hole transport layer 120 may be applied, for example deposited, on or above the first electrode 110, and the emitter layer 118 may be applied, for example deposited, on or above the hole transport layer 120.

In various embodiments, electron transport layer 122 may be applied, for example deposited, on or above the emitter layer 118.

In various embodiments, the organic electroluminescent layer structure 112 (that is to say for example the sum of the thicknesses of hole transport layer(s) 120 and emitter layer(s) 118 and electron transport layer(s) 122) may have a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic electroluminescent layer structure 112 may have for example a stack of a plurality of organic light emitting diodes (OLEDs) arranged directly one above another, wherein each OLED may have for example a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic electroluminescent layer structure 112 may have for example a stack of two, three or four OLEDs arranged directly one above another, in which case for example the organic electroluminescent layer structure 112 may have a layer thickness of a maximum of approximately 3 µm.

The light emitting component 100 may optionally generally include further organic functional layers, for example arranged on or above the one or the plurality of emitter layers 118 or on or above the electron transport layer(s) 122, which serve to further improve the functionality and thus the efficiency of the light emitting component 100.

The second electrode 114 (for example in the form of a second electrode layer 114) may be applied on or above the organic electroluminescent layer structure 112 or, if appropriate, on or above the one or the plurality of further organic functional layers.

In various embodiments, the second electrode 114 may include or be formed from the same materials as the first electrode 110, metals being particularly suitable in various embodiments.

In various embodiments, the second electrode 114 (for example for the case of a metallic second electrode 114) may have for example a layer thickness of less than or equal to approximately 50 nm, for example a layer thickness of less than or equal to approximately 45 nm, for example a layer thickness of less than or equal to approximately 40 nm, for example a layer thickness of less than or equal to approximately 35 nm, for example a layer thickness of less than or equal to approximately 30 nm, for example a layer thickness of less than or equal to approximately 25 nm, for example a layer thickness of less than or equal to approximately 20 nm, for example a layer thickness of less than or equal to approximately 15 nm, for example a layer thickness of less than or equal to approximately 10 nm.

The second electrode 114 may generally be formed in a similar manner to the first electrode 110, or differently than the latter. In various embodiments, the second electrode 114 may be formed from one or more of the materials and with the respective layer thickness, as described above in connection with the first electrode 110. In various embodiments, both the first electrode 110 and the second electrode 114 are formed as translucent or transparent. Consequently, the light emitting component 100 illustrated in FIG. 1 may be designed as a top and bottom emitter (to put it another way as a bidirectionally emitting light emitting component 100).

The second electrode 114 may be formed as an anode, that is to say as a hole-injecting electrode, or as a cathode, that is to say as an electron-injecting electrode.

The second electrode 114 may have a second electrical terminal, to which a second electrical potential (which is different than the first electrical potential), provided by the energy source, may be applied. The second electrical potential may have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

An encapsulation 116, for example in the form of a barrier thin-film layer/thin-film encapsulation 116, may optionally also be formed on or above the second electrode 114 and thus on or above the electrically active region 108.

In the context of this application, a "barrier thin-film layer" or a "barrier thin film" 116 may be understood to mean, for example, a layer or a layer structure which is suitable for forming a barrier against chemical impurities or atmospheric substances, in particular against water (moisture) and oxygen. In other words, the barrier thin-film layer 116 is formed in such a way that OLED-damaging substances such as water, oxygen or solvent cannot penetrate through it or at most very small proportions of said substances may penetrate through it.

In accordance with one configuration, the barrier thin-film layer 116 may be formed as an individual layer (to put it another way, as a single layer). In accordance with an alternative configuration, the barrier thin-film layer 116 may include a plurality of partial layers formed one on top of another. In other words, in accordance with one configuration, the barrier thin-film layer 116 may be formed as a layer stack. The barrier thin-film layer 116 or one or a plurality of partial layers of the barrier thin-film layer 116 may be formed for example by means of a suitable deposition method, e.g. by means of an atomic layer deposition (ALD) method in accordance with one configuration, e.g. a plasma enhanced atomic layer deposition (PEALD) method or a plasmaless atomic layer deposition (PLALD) method, or by means of a chemical vapor deposition (CVD) method in accordance with another configuration, e.g. a plasma enhanced chemical vapor deposition (PECVD) method or a plasmaless chemical vapor deposition (PLCVD) method, or alternatively by means of other suitable deposition methods.

By using an atomic layer deposition (ALD) method, it is possible for very thin layers to be deposited. In particular, layers having layer thicknesses in the atomic layer range may be deposited.

In accordance with one configuration, in the case of a barrier thin-film layer 116 having a plurality of partial layers, all the partial layers may be formed by means of an atomic layer deposition method. A layer sequence including only ALD layers may also be designated as a "nanolaminate".

In accordance with an alternative configuration, in the case of a barrier thin-film layer 116 including a plurality of partial layers, one or a plurality of partial layers of the barrier thin-film layer 116 may be deposited by means of a different deposition method than an atomic layer deposition method, for example by means of a vapor deposition method.

In accordance with one configuration, the barrier thin-film layer 116 may have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

In accordance with one configuration in which the barrier thin-film layer 116 includes a plurality of partial layers, all the partial layers may have the same layer thickness. In accordance with another configuration, the individual partial layers of the barrier thin-film layer 116 may have different layer thicknesses. In other words, at least one of the partial layers may have a different layer thickness than one or more other partial layers.

In accordance with one configuration, the barrier thin-film layer 116 or the individual partial layers of the barrier thin-film layer 116 may be formed as a translucent or transparent layer. In other words, the barrier thin-film layer 116 (or the individual partial layers of the barrier thin-film layer 116) may consist of a translucent or transparent material (or a material combination that is translucent or transparent).

In accordance with one configuration, the barrier thin-film layer 116 or (in the case of a layer stack having a plurality of partial layers) one or a plurality of the partial layers of the barrier thin-film layer 116 may include or consist of one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. In various embodiments, the barrier thin-film layer 116 or (in the case of a layer stack having a plurality of partial layers) one or a plurality of the partial layers of the barrier thin-film layer 116 may include one or a plurality of high refractive index materials, to put it another way one or a plurality of materials having a high refractive index, for example having a refractive index of at least 2.

On or above the barrier thin-film layer 116, it is possible to provide an adhesive and/or a protective lacquer 124, by means of which, for example, a cover 126 (for example a glass cover 126) is fixed, for example adhesively bonded, on the barrier thin-film layer 116. In various embodiments, the optically translucent layer composed of adhesive and/or protective lacquer 124 may have a layer thickness of greater than 1 µm, for example a layer thickness of several µm. In various embodiments, the adhesive may include or be a lamination adhesive.

In various embodiments, light-scattering particles may also be embedded into the layer of the adhesive (also designated as adhesive layer), which particles may lead to a further improvement in the color angle distortion and the coupling-out efficiency. In various embodiments, the light-scattering particles provided may be dielectric scattering particles, for example, such as metal oxides, for example, such as e.g. silicon oxide ($SiO_2$), zirconium oxide ($ZrO_2$), aluminum oxide, or titanium oxide. Other particles may also be suitable provided that they have a refractive index that is different than the effective refractive index of the matrix of the translucent layer structure, for example air bubbles, acrylate, or hollow glass beads. Furthermore, by way of example, metallic nanoparticles, metals such as gold, silver, iron nanoparticles, or the like may be provided as light-scattering particles.

In various embodiments, between the second electrode 114 and the layer composed of adhesive 124 and/or protective lacquer 124, an electrically insulating layer (not shown) may also be applied, for example SiN, for example having a layer thickness in a range of approximately 300 nm to approximately 1.5 µm, for example having a layer thickness in a range of approximately 500 nm to approximately 1 µm, in order to protect electrically unstable materials, during a wet-chemical process for example.

In various embodiments, the adhesive may be designed in such a way that it itself has a refractive index which is less than the refractive index of the cover 126. Such an adhesive may be for example a low refractive index adhesive such as, for example, an acrylate which has a refractive index of approximately 1.3. Furthermore, a plurality of different adhesives forming an adhesive layer sequence may be provided.

Furthermore, it should be pointed out that, in various embodiments, an adhesive 124 may also be completely dispensed with, for example in embodiments in which the cover 126, for example composed of glass, is applied to the barrier thin-film layer 116 by means of plasma spraying, for example.

In various embodiments, the cover 126 and/or the adhesive 124 may have a refractive index (for example at a wavelength of 633 nm) of 1.55.

Furthermore, in various embodiments, one or a plurality of antireflective layers (for example combined with the encapsulation 116, for example the thin-film encapsulation 116) may additionally be provided in the light emitting component 100.

Figure 2:
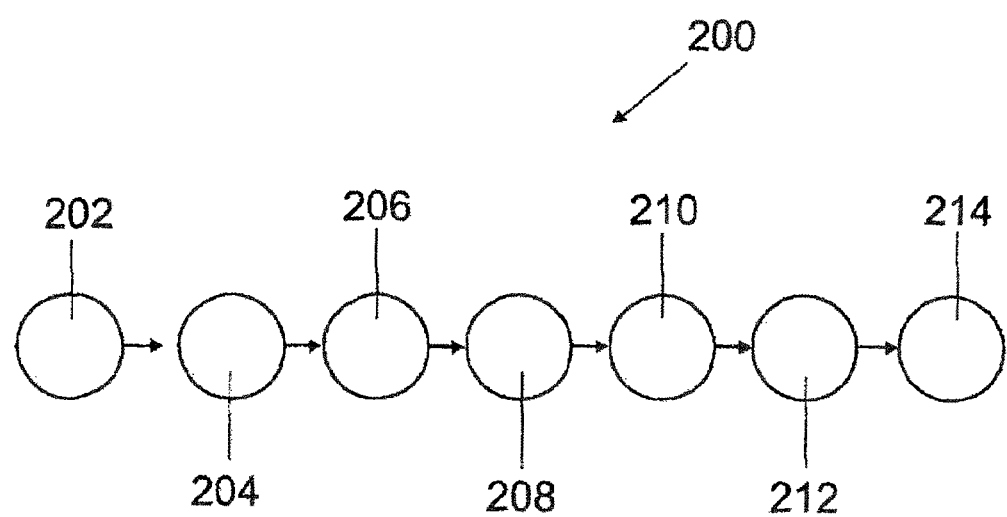
FIG. 2 shows a flowchart of a method for producing a protective layer, in accordance with various embodiments.

FIG. 2 shows a flowchart 200 of a method for producing a protective layer 106, in accordance with various embodiments.

The illustration shows preparing a carrier 202, applying a glass layer precursor 204, drying the glass layer precursor 206, removing nonvolatile organic constituents from the glass layer (binder removal) 208, liquefying the glass layer precursor 210 or liquefying (vitrifying) the glass powder layer 210, solidifying the glass 212 and setting the surface properties 214, wherein setting the surface properties 214 may be optional.

Preparing 202 the carrier, for example a soda-lime silicate glass having a refractive index of approximately 1.5, may include for example applying a barrier layer 104, for example $SiO_2$, cleaning the surface of the carrier 102 or the barrier layer 104 or setting the surface roughness or chemical groups on the surface 302 of the carrier 102 or the barrier layer 104.

Preparing 202 the carrier 102 may be followed by applying, for example by means of screen printing or stencil printing, a glass layer precursor 204 to the carrier 102, for example with a glass powder suspension or glass powder paste, which may include a powder including bismuth borate glass particles or bismuth borosilicate glass particles, having for example a refractive index in a range of between approximately 1.7 and approximately 2.1.

The glass powder suspension or glass powder paste may include a commercially available screen printing medium (e.g. nitrocellulose in ethyl acetate or cellulose derivatives in glycol ethers).

The bismuth borate glass particles or bismuth borosilicate glass particles may have for example a grain size distribution D50 of approximately 1 µm and a coefficient of thermal expansion of approximately $8.5 \cdot 10^{-6}$ 1/K for the temperature range of approximately 50° C. to approximately 350° C.

Alternatively, by way of example, it is also possible to select bismuth zinc borate glass particles or bismuth zinc borosilicate glass particles having a grain size distribution D50 of approximately 7 μm and a coefficient of thermal expansion of approximately $10 \cdot 10^{-6}$ 1/K for the temperature range of approximately 50° C. to approximately 300° C.

After applying 204 the glass layer precursor 310, the method may include drying 206 the glass layer precursor 310, for example at 70° C. for 3 hours, in order to remove volatile constituents.

Drying 206 the glass layer precursor 310 may be followed by thermally removing the nonvolatile organic constituents in the dried glass layer precursor 310 by means of removing nonvolatile organic constituents 208, for example by means of pyrolysis. The screen printing medium should be chosen in such a way that binder removal is concluded before the glass powder softens. Since the bismuth borosilicate glass used may start to soften starting from approximately 500° C., the two binder-solvent systems mentioned above are well suited to this glass, since they may burn out already between approximately 200° C. and approximately 400° C., depending on the system.

Removing the nonvolatile organic constituents 208 may be followed by liquefying 210 the glass layer precursor 310.

In the case of the bismuth borosilicate glass mentioned above as glass powder layer 310, the vitrifying may take place at temperatures above approximately 500° C.

In the example of a soda-lime silicate glass as carrier 102 having an annealing temperature of approximately 550° C., the upper temperature limit, in order that deformation of the carrier is kept small or avoided, may have a value of approximately 600° C. depending on the heating method. The viscosity of the glass layer precursor 304 or of the glass particles 306 is reduced during vitrification. As a result, the glass layer precursor 304 or the glass particles 306 may form a protective layer 106 on the surface 302 of the carrier 102. This process is also designated as vitrification. If the vitrification takes place below the transformation temperature of the carrier 102 or carrier glass 102, then no thermal stresses are incorporated therein. The coefficient of thermal expansion of the two composite partners, i.e. of the carrier 102 and of the glass solder 306, should not differ to an excessively great extent, in order to avoid excessively high composite stresses between the carrier 102 and the protective layer 106 and thus to ensure a permanent connection.

Since the protective layer 106 may have a similar effect to a barrier layer, a barrier thin-film layer 104 could be dispensed with, for example if the glass matrix 312 is alkali-free.

By means of the vitrification, it is possible to reduce the thickness of the protective layer 106 relative to the thickness of the glass layer precursor 304, by means of filling the interspaces 308 between the glass particles 306, for example to a thickness of approximately 10 μm.

Liquefying the glass layer precursor 210 and forming a glass layer may be followed by solidifying 212 the glass 306, for example by means of cooling, for example passive cooling. The protective layer 106 may be formed by means of the process of solidifying 212 the glass 306.

Solidifying 212 the protective layer 106 may be followed by setting the surface property 214 of the protective layer 106, for example polishing, i.e. smoothing the surface 402 of the protective layer 106, for example by means of briefly locally increasing the temperature, for example by means of directed plasma, for example as fire polishing or as laser polishing.

Figure 3:
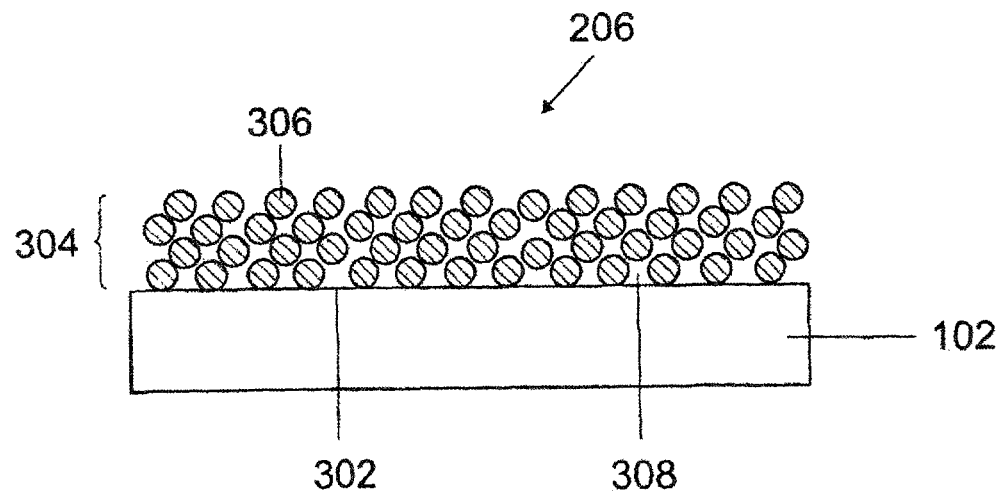
FIG. 3 shows a schematic cross-sectional view of a protective layer in a method for producing a protective layer after the removal of nonvolatile organic constituents of the glass layer precursor with glass particles on the surface of a carrier, in accordance with various embodiments.

FIG. 3 shows a schematic cross-sectional view of a protective layer 106 in a method for producing a protective layer 200, after removal of nonvolatile organic constituents 206 of a glass layer precursor 304 with glass particles 306 on the surface 302 of a carrier 102, in accordance with various embodiments.

By means of removing 206 nonvolatile organic constituents of the glass layer precursor 304, it is possible to form a free volume 308 between the glass particles 306. In this case, the precursor layer 304 describes the applied layers of the glass particles 306 with or without volatile and/or nonvolatile organic constituents.

Figure 4:
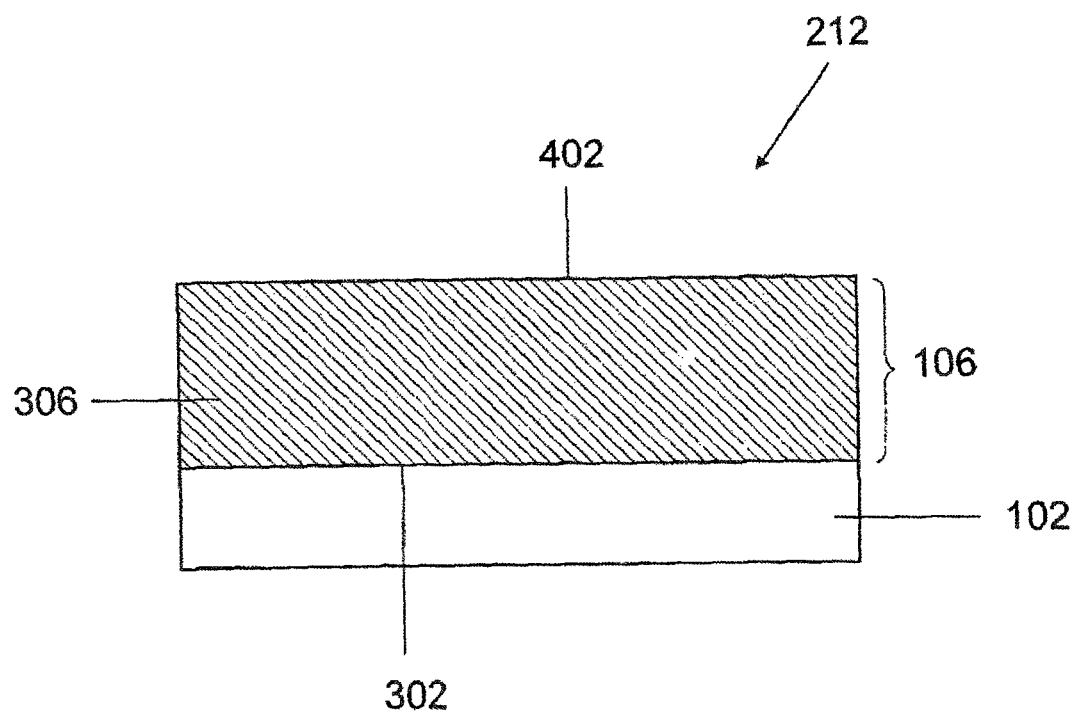
FIG. 4 shows a schematic cross-sectional view of a protective layer in a method for producing a protective layer after the liquefying of a glass solder and flowing of the glass solder on the surface of the carrier, in accordance with various embodiments.

FIG. 4 shows a schematic cross-sectional view of the protective layer 106 in the method for producing a protective layer 200 in accordance with various embodiments, after liquefying 210 and solidifying 212 the glass solder 306 and flowing on the surface 302 for example of the carrier 102.

By means of liquefying 210 the glass solder 306, it is possible to fill the free volume 308 between the glass particles 308 and to form a smooth, pore-free surface 402 on the protective layer 106. It is also possible for the formation of the smooth, pore-free surface 402 to be set only after a treatment 214 of the surface, for example a polishing.

The illustrated layer cross section of the protective layer 106 corresponds, for example, to the layer cross section after solidifying 216 the liquefied glass particles 308 and forming the glass layer 408 or the glass matrix 408. The glass 408 may have a free surface 402 and share a common interfaces 404 with the carrier 102 or the barrier layer 104.

Figure 5:
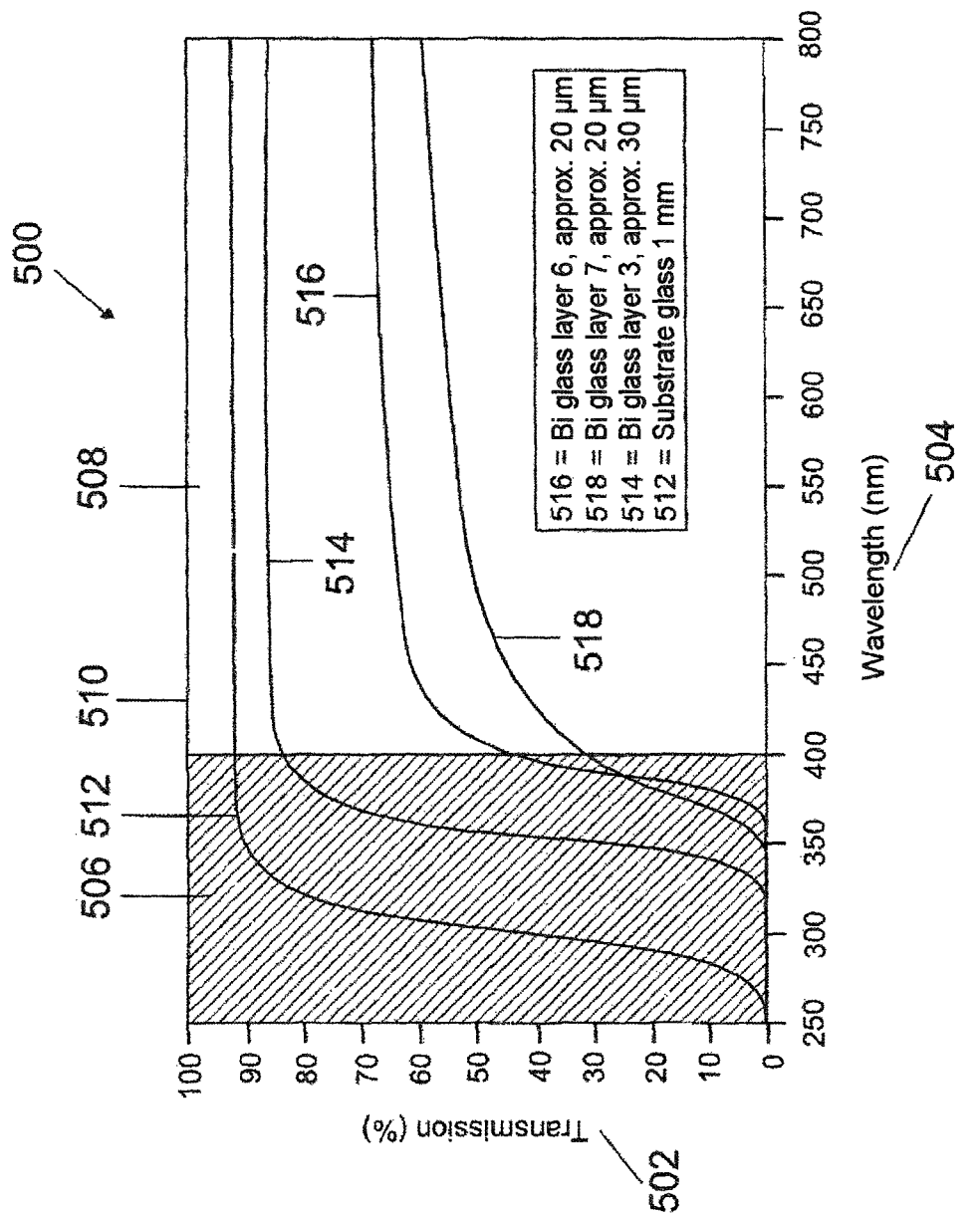
FIG. 5 shows a diagram concerning the transmission of electromagnetic radiation through different structures, in accordance with various embodiments.

FIG. 5 shows a diagram 500 concerning the transmission of electromagnetic radiation through different structures, in accordance with various embodiments.

The transmission spectrum 500 in FIG. 5 illustrates the transmission 502 of electromagnetic radiation having different wavelengths 504 through a carrier 512, and through the carrier 512 with different $Bi_2O_3$-containing protective layers 514, 516, 518. The wavelength range 504 of the electromagnetic radiation may be subdivided into a visible range 508 safe for organic substances and a harmful UV range 506, wherein the two ranges 506, 508 merge into one another, i.e. are separated from one another by the UV edge 510 at a wavelength of approximately 400 nm.

Different Bi-containing protective layers 106 may be applied to a carrier 512 (thickness of approximately 1 mm) by means of a process of printing a glass layer precursor 304 and may be formed in accordance with the description of FIG. 2 (vitrification). From the vitrified protective layers 516, 518 having a thickness of approximately 20 μm and 514 with approximately 30 μm, it is possible to measure the transmission 502 with respect to incident electromagnetic radiation having different wavelengths 504.

The uncoated carrier 512 has a higher transmission in the UV range 506 than the carriers with Bi-containing protective layers 514, 516, 518 and thus has lower UV protection than the carriers with Bi-containing protective layers 514, 516, 518.

By means of the choice of the Bi-containing glass and the layer thickness of the protective layer 106, it is possible to form UV protection for the organic functional layer structure 112 in a wide range of the harmful wavelengths 506 of the electromagnetic radiation by means of the protective layers 514, 516, 518.

Figure 6:
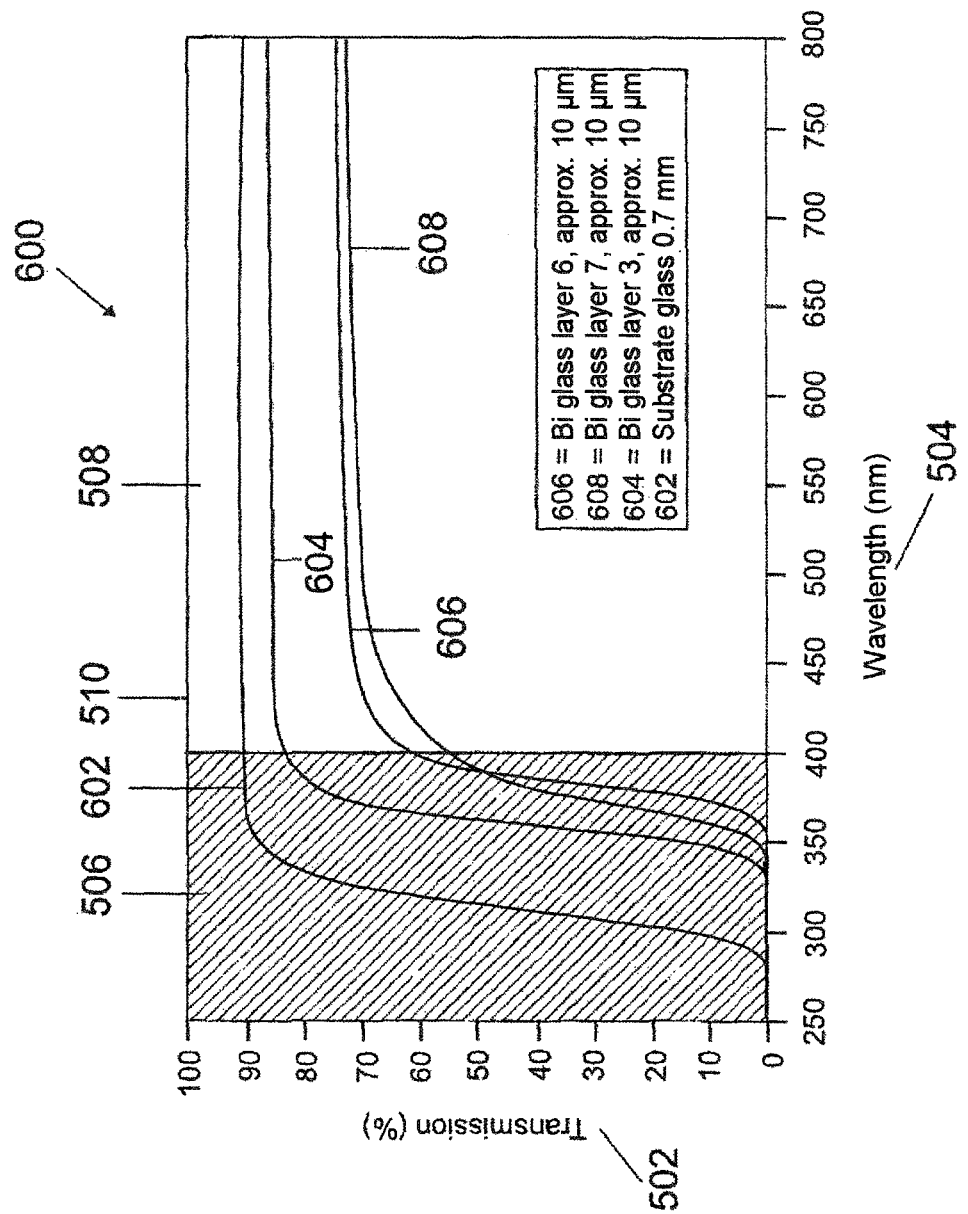
FIG. 6 shows a diagram concerning the transmission of electromagnetic radiation through different structures, in accordance with various embodiments.

FIG. 6 shows a diagram 600 concerning the transmission of electromagnetic radiation through different protective layers, in accordance with various embodiments.

The transmission spectrum 600 in FIG. 6 illustrates the transmission 502 of electromagnetic radiation having different wavelengths 504 through the carrier 602, and through the carrier 602 with different $Bi_2O_3$-containing protective layers 604, 606, 608. The wavelength range 504 of the electromagnetic radiation may be subdivided into a visible range 508 safe for organic substances and a harmful UV range 506, wherein the two ranges 506, 508 merge into one another, i.e. are separated from one another by the UV edge 510 at a wavelength of approximately 400 nm.

In a further configuration, different Bi-containing protective layers 604, 606, 608 may be applied by means of screen printing of glass layer precursors 304 onto a soft glass substrate 102 (602), with a thickness of approximately 0.7 mm and, after vitrification and cooling 212, may have for example a layer thickness of approximately 10 μm.

The formation of the protective layer 106 from the glass layer precursor 304 may be formed in accordance with that in the description of FIG. 2.

The uncoated carrier 602 has a higher transmission than the carriers with Bi-containing protective layers 604, 606, 608 and therefore does not have sufficient UV protection. By contrast, the carriers with Bi-containing protective layers 604, 606, 608 exhibit UV protection. Given a thickness of the protective layer of approximately 10 μm or thinner, a portion of harmful UV radiation may be transmitted through the protective layer 106.

Figure 7:
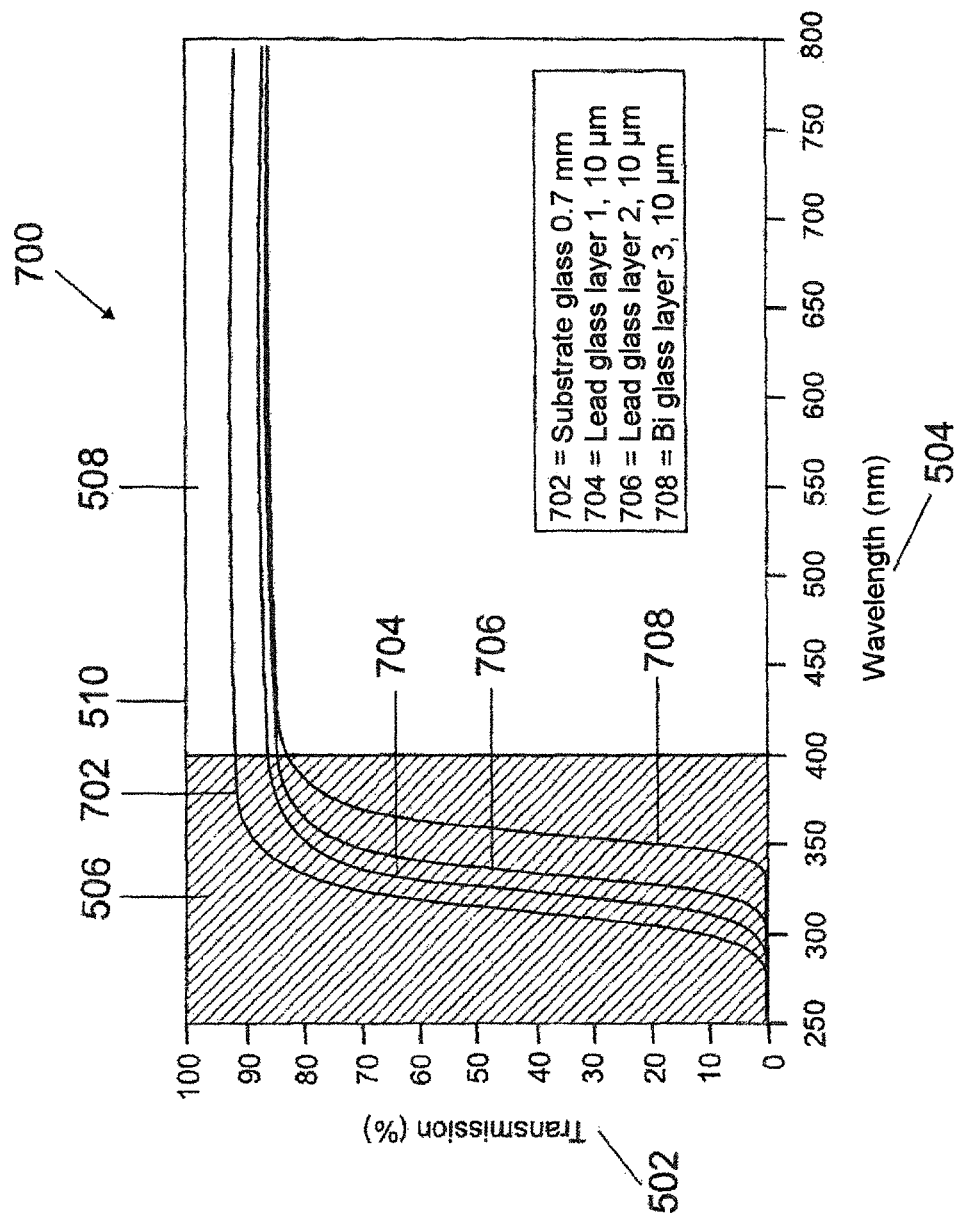
FIG. 7 shows a diagram concerning the transmission of electromagnetic radiation through different structures, in accordance with various embodiments.

FIG. 7 shows a diagram 700 concerning the transmission of electromagnetic radiation through different protective layers, in accordance with various embodiments.

The transmission spectrum 700 in FIG. 7 illustrates the transmission 502 of electromagnetic radiation having different wavelengths 504 through the carrier 702, and through the carrier 702 with different lead-containing protective layers 704, 706 in comparison with a bismuth-containing protective layer 708. The wavelength range 504 of the electromagnetic radiation may be subdivided into a visible range 508 safe for organic substances and a harmful UV range 506, wherein the the two range 506, 508 merge into one another, i.e. are separated from one another by the UV edge 510 at a wavelength of approximately 400 nm.

FIG. 7 illustrates the transmission curves of a soft glass substrate having a thickness of approximately 0.7 mm and of comparable glass carriers with Pbo-containing glass layers and Bi-containing glass layers having a thickness of approximately 10 μm.

The glass layer precursor 304 including lead-containing glass, for example including lead borate glass or lead borosilicate glass, may be applied by means of screen printing onto a glass substrate 102 having a thickness of approximately 0.7 mm and may be formed after cooling 212 to result in a layer that is as smooth and pore-free as possible and has for example a layer thickness of approximately 10 μm.

The formation of the protective layer 106 from the glass layer precursor 304 may be formed in accordance with that in the description of FIG. 2.

The uncoated carrier 702 has a higher transmission than the carrier with a Bi-containing protective layer 708 or the lead-containing protective layers 704, 706 and thus has lower UV protection than the carrier with a Bi-containing protective layer 708 or the lead-containing protective layers 704, 706.

The lead-containing protective layers 704, 706 may afford higher UV protection than the carrier 702. In the case of the layer thickness chosen, however, the lead-containing protective layers 704, 706 may exhibit a lower absorption of UV radiation and thus lower UV protection than the Bi-containing protective layer 708.

Figure 8:
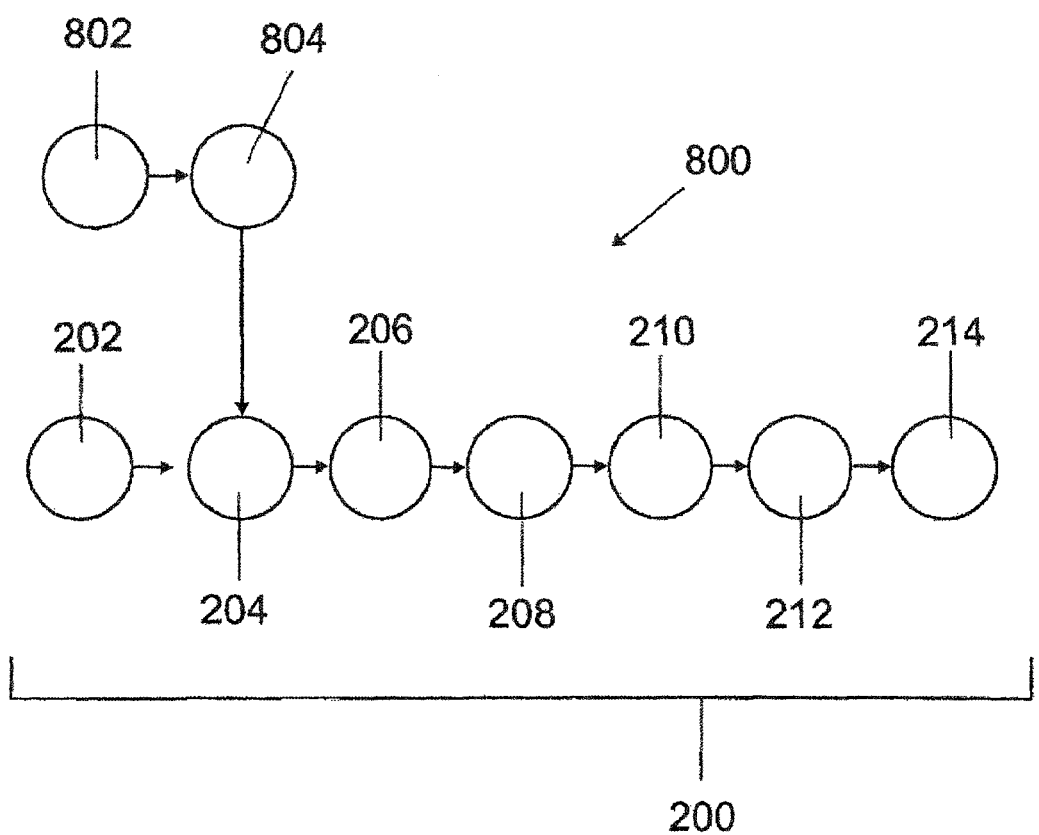
FIG. 8 shows a flowchart of a method for producing a protective layer, in accordance with various embodiments.

FIG. 8 shows a flowchart 800 of a method for producing a protective layer 106, in accordance with various embodiments.

In one configuration for producing a protective layer 106, in order to increase the UV absorption, UV-absorbing additives 902, for example $TiO_2$, $CeO_2$, $Bi_2O_3$, ZnO or $SnO_2$ having an average grain size in a range of approximately 0.1 to approximately 1 μm may be added to the glass solder, for example to the glass solder powder 306 in the glass solder powder paste 306, wherein the UV-absorbing additives 902 should be distributed homogeneously in the glass solder powder paste 306.

In one configuration for producing a protective layer 106, in order to increase the UV absorption, UV-absorbing additives 902, for example UV-absorbing nanoparticles 902 (not illustrated), may be added to the glass solder, for example to the glass solder powder 306 in the glass solder powder paste, wherein the UV-absorbing additives 902 should be distributed homogeneously in the glass solder powder paste 306.

The UV-absorbing nanoparticles 902 may have no or low solubility in the molten glass solder 306 and/or may not react or react only poorly therewith. Furthermore, the nanoparticles may lead to no or only to little scattering of electromagnetic radiation, for example nanoparticles having a grain size of less than approximately 50 nm, for example composed of $TiO_2$, $CeO_2$, ZnO or $Bi_2O_3$.

In a further configuration, the UV-absorbing additives 902 (not illustrated) may include a phosphor or be formed therefrom, wherein the phosphor has an absorption in the UV range 506.

In another configuration, the additives 902 may include a UV-absorbing glass or be formed therefrom.

The UV-absorbing additives 902 composed of glass or phosphors may have an average grain size in a range of approximately 50 nm to approximately 10 μm, for example in a range of approximately 0.1 μm to approximately 1 μm.

In addition to the absorption of electromagnetic radiation in the UV range 506, the UV-absorbing additives 902 may bring about an increase in the coupling-out of light from the optoelectronic component 100 by means of scattering.

In a further configuration, the glass powder is mixed with at least one type of UV-absorbing additives and applied to the carrier 102 as a paste or suspension by means of screen or stencil printing. As a result, a homogeneous distribution of the UV-absorbing additives in the glass matrix may be formed after vitrification.

The at least one type of UV-absorbing additives may include a UV-absorbing additive from the group of UV-absorbing additives: UV-absorbing particles 902, such as $TiO_2$, $CeO_2$, $Bi_2O_3$, ZnO or $SnO_2$ having an average grain size of 0.1-1 μm, nanoparticles 902, phosphor 902 or UV-absorbing glass particles 902; wherein each of the UV-absorbing additives 902 with the glass matrix 306, i.e. the protective layer 106 with UV-absorbing additives 902, have a low transmission of UV radiation than the carrier 102.

After preparing 202 the surface 302 of the carrier 102 or the barrier thin-film layer 104, it is possible for the glass powder suspension or the glass powder paste with UV-absorbing additives to be applied (204) to the surface 302. Indications concerning the further method steps 206, 208, 210, 212, 214 and substances or substance mixtures, for example of the glass solder 306, of the binder, etc., which are necessary for forming the protective layer 106 may be implemented in accordance with the description of FIG. 2.

Figure 9:
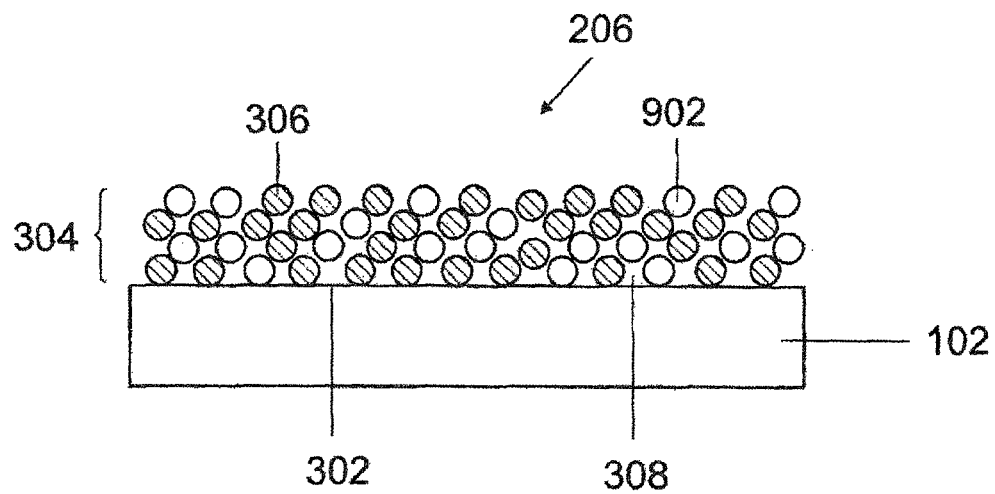
FIG. 9 shows a schematic cross-sectional view of a protective layer in a method for producing a protective layer after the removal of nonvolatile organic constituents of a glass layer precursor with glass particles with UV-absorbing additives on the surface of a carrier, in accordance with various embodiments.

FIG. 9 shows a schematic cross-sectional view of a protective layer 106 in a method for producing a protective layer 800, after removal of nonvolatile organic constituents 206 of a glass layer precursor 304 with glass particles 306 and UV-absorbing additives 902 on the surface 302 of a carrier 102, in accordance with various embodiments. In the embodiment illustrated, the glass powder was mixed with at least one type of UV-absorbing additives and applied to the carrier 102 as a paste or suspension by means of screen or stencil printing.

By means of removing 206 nonvolatile organic constituents of the glass layer precursor 304, it is possible to form a free volume 308 between the glass particles 306. In this case, the precursor layer 304 describes the applied layers of the glass particles 306 with or without volatile and/or nonvolatile organic constituents. The UV-absorbing additives 902 are be mixed homogeneously with the glass particles 306.

Figure 10:
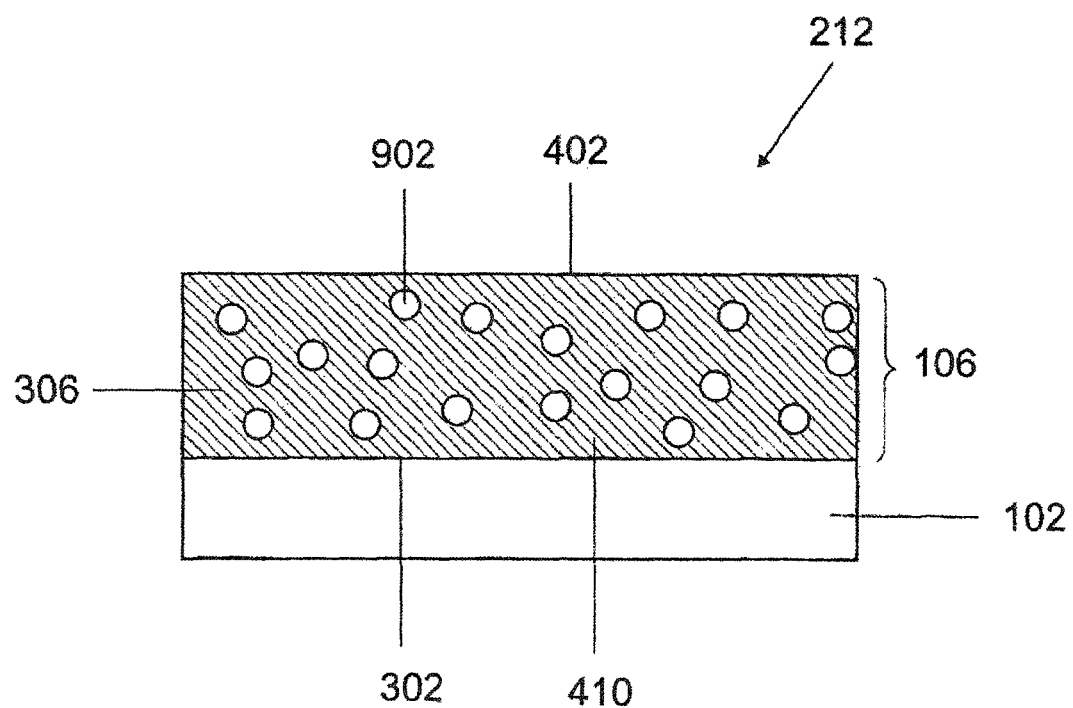
FIG. 10 shows a schematic cross-sectional view of a protective layer in the method for producing a protective layer after the liquefying of a glass solder with UV-absorbing additives and flowing of the glass solder on the surface for example of the carrier, in accordance with various embodiments.

FIG. 10 shows a schematic cross-sectional view of the protective layer 106 in the method for producing a protective layer 800 in accordance with various embodiments, after liquefying 210 and solidifying 212 the glass solder 306 with the UV-absorbing additives 902 and flowing on the surface 302 for example of the carrier 102.

By means of liquefying 210 the glass solder 306, it is possible to fill the free volume 308 between the glass particles 308 and to form a smooth, pore-free surface 402 on the protective layer 106. It is also possible for the formation of the smooth, pore-free surface 402 to be set only after a treatment 214 of the surface, for example a polishing.

The UV-absorbing additives 902, for example in accordance with the description of FIG. 8, after solidification 212 of the glass particles 306 that were liquefied and flowed, i.e. after the formation of the protective layer 106, may be distributed in the glass 306 of the protective layer 106, for example homogeneously.

Figure 11:
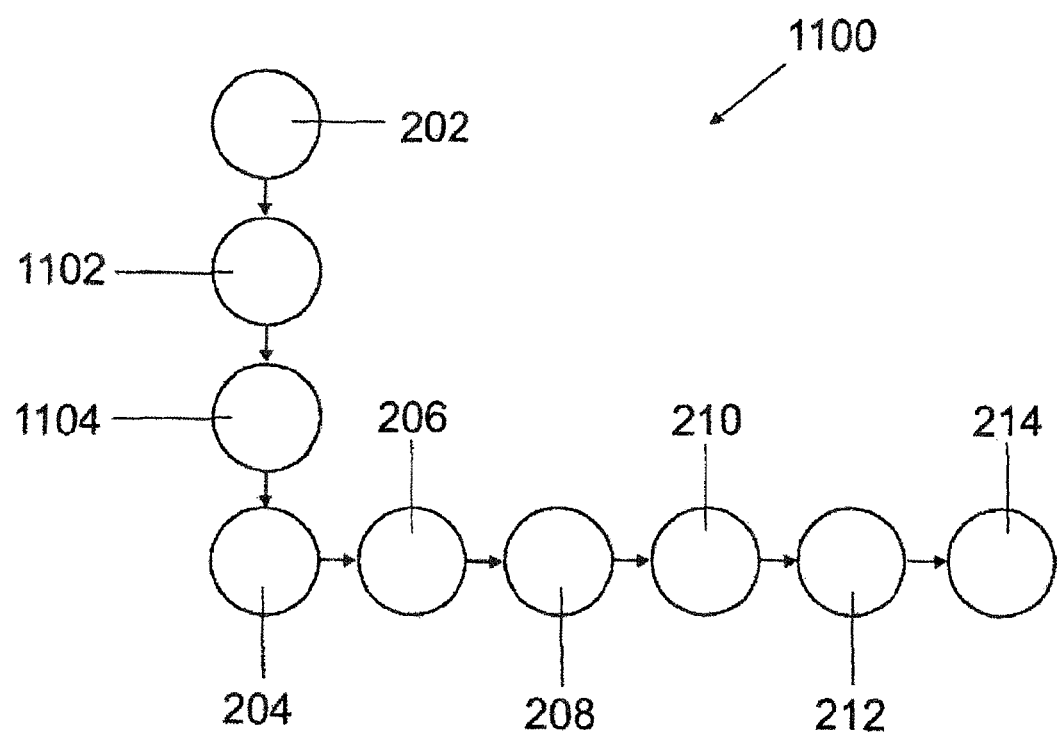
FIG. 11 shows a flowchart of a method for producing a protective layer, in accordance with various embodiments.

FIG. 11 shows a flowchart 1100 of a further method for producing a protective layer 106, in accordance with various embodiments.

The illustration shows preparing the carrier 202, applying the scattering center precursor 1102, drying the scattering center precursor 1104, applying the glass layer precursor 204, drying the glass layer precursor 206, removing nonvolatile organic constituents from the scattering center layer and the glass layer (binder removal) 208, liquefying the glass layer precursor 210 or liquefying (vitrifying) the glass powder layer 210, solidifying the glass 212 and setting the surface properties 214, wherein setting the surface properties 214 may be optional. The scattering center precursor may include UV-absorbing, scattering particles, for example $TiO_2$, $CeO_2$, $Bi_2O_3$, ZnO or $SnO_2$ having an average grain size in a range of approximately 0.1 to approximately 1 µm, phosphor or non-UV-absorbing, only scattering particles, for example $Al_2O_3$, $SiO_2$, $Y_2O_3$ or $ZrO_2$ having an average grain sizes in a range of approximately 0.1 to approximately 1 µm.

Preparing 202 the carrier, for example a soda-lime silicate glass having a refractive index of approximately 1.5, may include for example applying a barrier layer 104, for example $SiO_2$, cleaning the surface of the carrier 102 or the barrier layer 104 or setting the surface roughness or chemical groups on the surface 302 of the carrier 102 or the barrier layer 104.

After preparing 202 the carrier 102, the scattering center precursor 1102 may be applied to the surface 302 of the carrier 102 or of the barrier layer 104. Applying the scattering center precursor 1102 may include for example applying a suspension or a paste including scattering centers 1202 and liquid and nonvolatile organic constituents to the surface 302.

What is essential to the method is liquefying the glass after applying scattering and/or UV-absorbing additives, for example the scattering centers. It is thereby possible to set the distribution of the scattering additives in the protective layer and to form a smooth surface of the protective layer in a single process of liquefying the glass, for example tempering process. Producing a suspension or paste from glass particles or with a glass powder should not be understood as liquefying in this sense, since the appearance of the glass particles is not altered by the suspension.

In one configuration, the substance or the substance mixture of the scattering centers 1202 may exhibit only low or no reduction of the UV transmission relative to the substance of the carrier 102, wherein the substance or the substance mixture of the scattering centers 1202 includes or is formed from a substance or a stoichiometric compound thereof from the group of substances: $Al_2O_3$, $SiO_2$, $ZrO_2$, $Y_2O_3$.

In a further configuration, the scattering centers 1202 may include or be formed from a UV-absorbing substance or a UV-absorbing substance mixture, for example $TiO_2$, $CeO_2$, ZnO, $Bi_2O_3$.

In another configuration, the scattering centers 1202 may include or be formed from a phosphor having an absorption in the UV range 506.

In another configuration, the scattering centers 1202 may include or be formed from a glass, for example glass particles, wherein the glass may additionally be embodied as UV-absorbing glass, but does not change or soften during the vitrification process.

The scattering particles 1202 including glass or phosphors may have an average grain size in a range of approximately 50 nm to approximately 10 µm, for example in a range of approximately 0.1 µm to approximately 1 µm.

In one configuration, which should be regarded as non-restrictive, from a screen-printable paste or suspension including oxidic scattering particles 306, for example KRONOS 2056 ($TiO_2$, $d_{50}$=0.45 µm) or CR10 ($Al_2O_3$, $d_{50}$=0.45 µm), and a commercially available screen printing medium (for example nitrocellulose in ethyl acetate or cellulose derivatives in glycol ethers), it is possible to form a thin screen printing layer 1204 or scattering center precursor 1204 having a wet layer thickness of, for example, approximately 30 µm.

Applying the scattering center precursor 1102 by means of volatile solvents, for example in a suspension or paste, is followed by drying 1104 the scattering center precursor 1204. The screen printing layer 1204 may be dried for example at 70° C. for 3 hours. The volatile constituents of the screen printing layer 1204 are removed during the drying 1104. However, the screen printing layer 1204 still includes nonvolatile organic constituents, such as the binder, which connects the scattering particles to one another and to the carrier and thereby imparts to the layer a certain mechanical strength for subsequent process steps.

After drying 1104 the screen printing layer 1204, it is possible to apply a glass layer precursor 304 for example by screen printing or stencil printing, for example with a glass powder suspension or glass powder paste, which may include a powder composed of lead borate glass particles or lead borosilicate glass particles.

The glass powder suspension or glass powder paste likewise contains a commercially available screen printing medium (e.g. nitrocellulose in ethyl acetate or cellulose derivatives in glycol ethers). The glass powder printing layer 304 may have for example a wet layer thickness of approximately 30 µm. The lead borate glass particles or lead borosilicate glass particles may have for example a refractive index in a range of approximately 1.7 to approximately 1.9. The lead borate glass particles or the lead borosilicate glass particles may have for example a grain size distribution with a D90<12 μm and a D50<3 μm. The coefficient of thermal expansion of the lead borate glass particles or of the lead borosilicate glass particles may be for example approximately $7.5 \cdot 10^{-6}$ 1/K for the temperature range of approximately 50° C. to approximately 400° C. and the coefficient of thermal expansion of the carrier including soda-lime silicate glass may be for example approximately $8.5$-$9 \cdot 10^{-6}$ 1/K.

The thickness of the glass layer precursor 304 may be such that the total volume of the glass 306 in the glass layer precursor 304 is greater than the free volume between the scattering centers 1206 and the volume of the volatile and nonvolatile organic substances, for example binders, solvents, or, to put it another way, greater than the total occupiable volume of the interspaces 1206 between the scattering centers 1202 in the scattering center precursor 1204.

In this case, the part of the protective layer above the scattering additives should have a thickness greater than or equal to the roughness of the topmost ply of the scattering and/or UV-absorbing additives, for example UV-absorbing scattering centers, for example light-scattering particles without glass, such that at least one smooth surface is formed, i.e. the surface has a low RMS roughness (root mean square—magnitude of the mean deviation), for example less than 10 nm. The roughness of the topmost ply of the scattering additives is dependent on the actual size of the scattering additives.

After applying 204 the glass layer precursor 304, the method may include drying 206 the glass layer precursor 304, for example at 70° C. for 3 hours, in order to remove volatile constituents.

Drying 206 the glass layer precursor 304 may be followed by thermally removing the nonvolatile organic constituents in the dried screen printing layer 1204 and the dried glass layer precursor 304 by means of removing nonvolatile organic constituents 208, for example by means of pyrolysis. The screen printing medium should be chosen in such a way that binder removal is concluded before the glass powder 306 softens. Since the lead borosilicate glass used may start to soften starting from approximately 500° C., the two binder-solvent systems mentioned above are well suited to this glass, since they may burn out already between approximately 200° C. and approximately 400° C., depending on the system.

The removal of nonvolatile organic constituents 208 in the scattering center precursor 1204 and the glass layer precursor 304 may form free volumes 1206, 308 in the scattering center precursor 1204 and the glass layer precursor 310.

Removing the nonvolatile organic constituents 208 may be followed by liquefying 210 the glass layer precursor 304.

In the case of the lead borosilicate glass solder mentioned above as glass powder layer 304, the vitrifying may take place at temperatures above approximately 500° C. In the example of a soda-lime silicate glass as carrier 102 having an annealing temperature of approximately 550° C., the upper temperature limit, in order that deformation of the carrier is kept small or avoided, may have a value of approximately 600° C. depending on the heating method. The viscosity of the glass layer precursor 304 or of the glass particles 306 is reduced during vitrification. As a result, the glass layer precursor 304 or the glass particles 306 may occupy the free volume 1206 between the scattering centers 1202 of the dried screen printing layer 1204. This process is also designed as vitrification. If the vitrification takes place below the transformation temperature of the carrier 102 or carrier glass 102, then no thermal stresses are incorporated therein. The coefficient of thermal expansion of the two composite partners, i.e. of the carrier 102 and of the glass solder 306, should not differ to an excessively great extent, in order to avoid excessively high composite stresses between the carrier 102 and the protective layer 106 and thus to ensure a permanent connection. Since the protective layer 106 may have a similar effect to a barrier layer, a barrier thin-film layer 104 could be dispensed with, for example if the glass matrix 306 is alkali-free.

By means of the vitrification, it is possible to reduce the thickness of the protective layer 106 relative to the thickness of the scattering center precursor 1204 and the layer thickness of the glass layer precursor 304, for example to a thickness of approximately 10 μm.

Liquefying the glass layer precursor 210 and flowing the liquid glass into the space 1206 between the scattering centers 1202 may be followed by solidifying 212 the glass 304, for example by means of cooling, for example passive cooling. The protective layer 106 may be formed by means of the process of solidifying 212 the glass 304.

Solidifying 212 the protective layer 106 may be followed by setting the surface property 214 of the protective layer 106, for example polishing, i.e. smoothing the surface 402 of the protective layer 106, for example by means of briefly locally increasing the temperature, for example by means of directed plasma, for example as fire polishing or as laser polishing.

In another configuration, for the glass layer precursor 304 it is possible to use lead borate glass particles or lead borosilicate glass particles having for example a grain size distribution with a D90<15 μm and a D50<6 μm. The lead borate glass particles or lead borosilicate glass particles may have a coefficient of thermal expansion of approximately $12.5 \cdot 10^{-6}$ 1/K, for example. With the use of this glass, the vitrification may be implemented at temperatures below approximately 500° C. since the softening of said glass may begin at approximately 360° C.

In a further configuration, for the glass layer precursor 304 it is also possible to use lead-free glass particles which may have a refractive index of between approximately 1.7 and approximately 2.1, for example. Said particles may be for example bismuth borate glass particles or bismuth borosilicate glass particles, having a grain size distribution D50 of approximately 1 μm and a coefficient of thermal expansion of approximately $8.5 \cdot 10^{-6}$ 1/K for the temperature range of approximately 50° C. to approximately 350° C. Alternatively, it is also possible to select for example bismuth zinc borate glass particles or bismuth zinc borosilicate glass particles having a grain size distribution D50 of approximately 7 μm and a coefficient of thermal expansion of approximately $10 \cdot 10^{-6}$ 1/K for the temperature range of approximately 50° C. to approximately 300° C.

The total layer thickness of the protective layer with scattering particles may be formed in a range of approximately 1 μm to approximately 100 μm.

Figure 12:
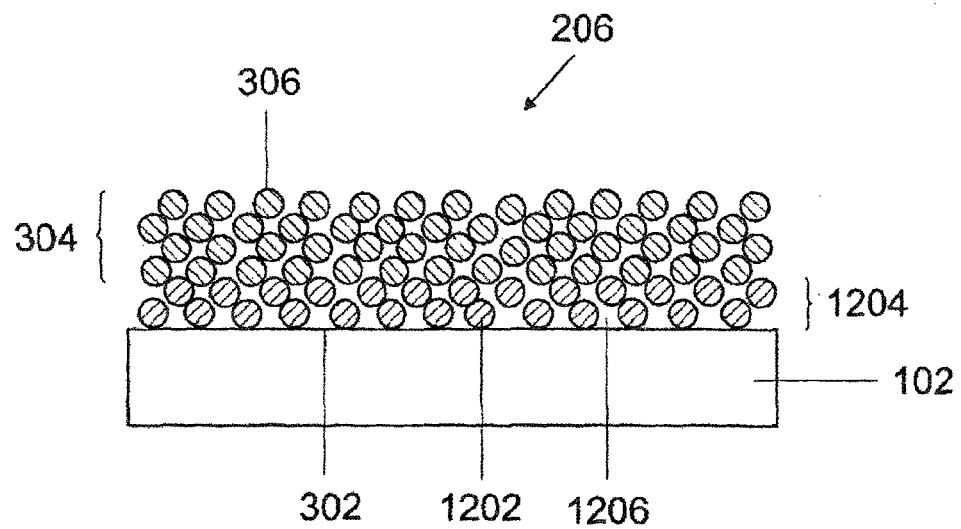
FIG. 12 shows a schematic cross-sectional view of a protective layer in the method for producing a protective layer after the removal of nonvolatile organic constituents of a glass layer precursor with glass particles and a scattering center precursor with scattering centers on the surface of a carrier, wherein the scattering centers may be UV-absorbing, in accordance with various embodiments.

FIG. 12 shows a schematic cross-sectional view of a protective layer 106 in the method for producing a protective layer 1100 after the removal of nonvolatile organic constituents 206 of a glass layer precursor 304 with glass particles 306 and a scattering center precursor 1204 with scattering centers 1202 on the surface 302 of a carrier 102, wherein the scattering centers 1202 may be UV-absorbing, in accordance with various embodiments.

By means of the removal of nonvolatile organic constituents of the scattering center precursor 1202 and of the glass layer precursor 304, it is possible to form a free volume 1206, 308 between the scattering centers 1202 and between the glass particles 304. In this case, the precursor layers 1204, 304 describe the applied layers of the scattering centers 1204 and glass particles 304 with or without volatile and/or nonvolatile organic constituents.

Figure 13:
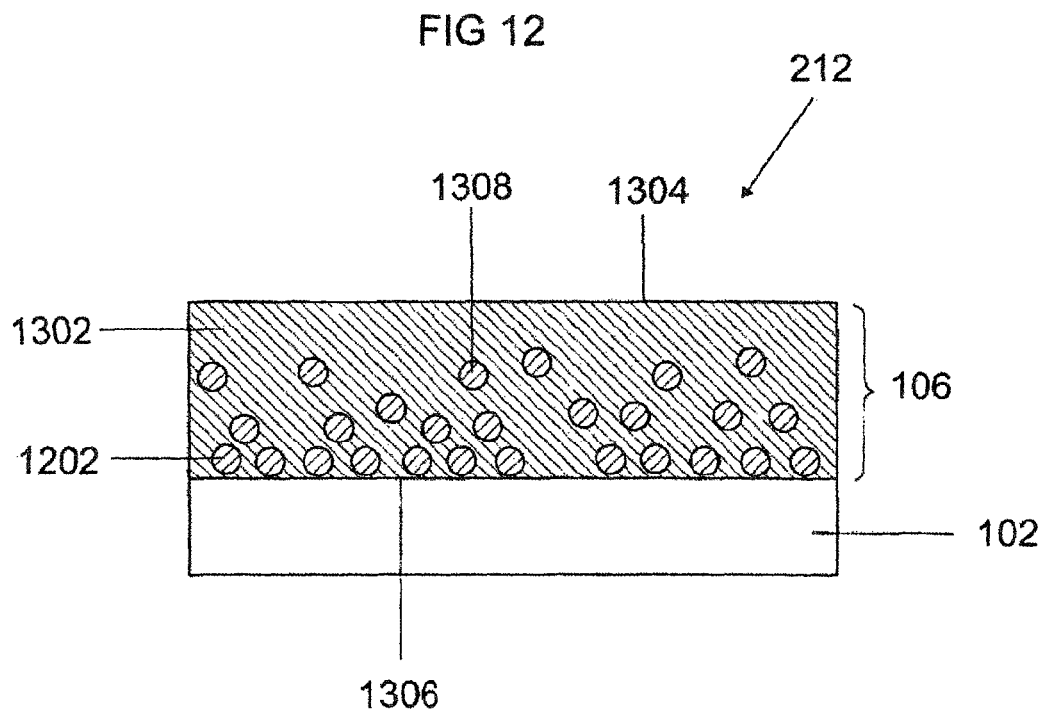
FIG. 13 shows a schematic cross-sectional view of the protective layer 106 in the method for producing a protective layer 1100 in accordance with various embodiments, after the liquefying 210 of the glass 304 and flowing into the free volume 1206 between the scattering centers 1202, wherein the scattering centers 1202 may also be UV-absorbing, in accordance with various embodiments.

FIG. 13 shows a schematic cross-sectional view of the protective layer 106 in the method for producing a protective layer 1100 in accordance with various embodiments, after the liquefying 210 of the glass 304 and flowing into the free volume 1206 between the scattering centers 1202, wherein the scattering centers 1202 may also be UV-absorbing, in accordance with various embodiments.

The illustrated layer cross section of the protective layer 106 corresponds for example to the layer cross section after the solidification 212 of the liquefied glass particles 304 and the formation of the glass layer 1302 or the glass matrix 1302. The glass 1302 may have a free surface 1304 and share a common interface 136 with the carrier 102 or the barrier layer 104. Furthermore, the glass layer 1302 may share one common interface 1308 or a plurality of common interfaces 1308 with the scattering centers 1202.

Electromagnetic radiation may be scattered at the interface 1308 of the glass matrix 1302 with the scattering centers 1202, as a result of which the coupling-out of light from the optoelectronic component may be increased, wherein the scattering centers 1202 may be UV-absorbing, for example.

Figure 14:
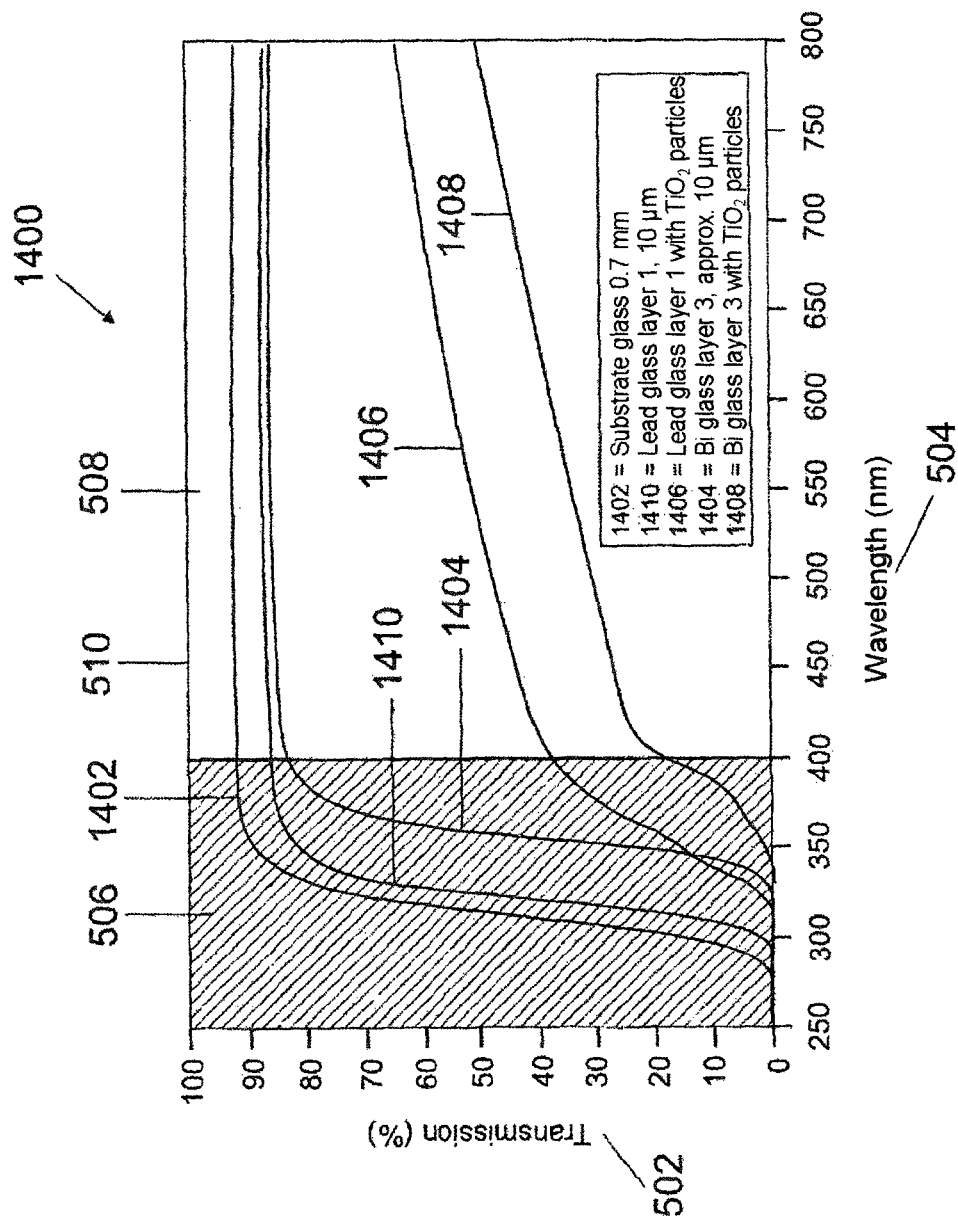
FIG. 14 shows a diagram concerning the transmission of electromagnetic radiation through different structures, in accordance with various embodiments.

FIG. 14 shows a diagram 1400 concerning the transmission of electromagnetic radiation through different structures, in accordance with various embodiments.

The transmission spectrum 1400 in FIG. 14 illustrates the transmission 502 of electromagnetic radiation having different wavelengths 504 through the carrier 1402, and through the carrier with different protective layers 1404, 1406, 1408, 1410. The wavelength range 504 of the electromagnetic radiation may be subdivided into a visible range 508 safe for organic substances and a harmful UV range 506, wherein the two ranges 506, 508 merge into one another, i.e. are separated from one another by the UV edge 510 at a wavelength of approximately 400 nm.

The illustration shows the transmissions of protective layers 106 including $TiO_2$ scattering centers in a Bi-containing 1408 glass matrix 1302 and a PbO-containing 1406 glass matrix 1302, which may have been formed for example by means of a method in accordance with the description from FIG. 11. In this case, the $TiO_2$ scattering centers are additionally UV-absorbing, i.e. in this configuration the $TiO_2$ scattering centers are the UV-absorbing additives 902 and additionally the scattering centers 1202 in one.

In addition, the illustration shows the transmission of a Bi-containing 1404 protective layer 106 and a PbO-containing 1410 protective layer 106, which may have been formed for example by means of a method in accordance with the description from FIG. 2.

The structures including protective layer 1404, 1406, 1408, 1410 were applied on comparable carriers 102, for example a soft glass substrate 102 having a thickness of approximately 0.7 mm. Therefore, the transmission 1402 of the carrier 102 may be used as a reference value for the structures with protective layer 1404, 1406, 1408, 1410. The protective layers 106 of the illustrated transmissions 1404, 1406, 1408, 1410 may in each case have a thickness of approximately 10 μm.

The uncoated carrier 1402 has a higher transmission and thus a lower UV protection than the carriers 102 with Bi-containing protective layer 1404, 1408 or lead-containing protective layer 1406, 1410.

The lead-containing protective layers 1406, 1410 may afford higher UV protection than the carrier 1402. In the case of the layer thickness chosen, however, the lead-containing protective layers 1406, 1410 may have a lower absorption of UV radiation and thus a lower UV protection than the Bi-containing protective layers 1404, 1408.

The UV-absorbing additives 902 may be formed in the protective layer 106 according to a method in accordance with the description of FIG. 8 or FIG. 11. By means of the UV-absorbing additives 902, the UV edge 510 may be shifted toward the right, i.e. to higher wavelengths 504, as a result of which the UV absorption for the Bi-containing protective layer (1408) and the lead-containing (1410) protective layer 106 was increased compared with those without scattering particles (1404 for Bi-containing and 1410 for lead-containing).

In various embodiments, an optoelectronic component and a method for producing an optoelectronic component are provided with which it is possible to protect organic optoelectronic components against UV radiation, without applying a UV-absorbing plastic film to the outer side of the component. As a result, it is possible to prevent an impairment of the esthetic appearance of the organic optoelectronic component. Furthermore, the process step of applying the plastic film to the optoelectronic component and the film itself may be obviated.

Furthermore, the UV-absorbing layer may advantageously be embodied such that the UV-absorbing particles simultaneously act as scatterers for visible light and the coupling-out of light from organic optoelectronic components is thereby increased.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:
1. An optoelectronic component, comprising:
a carrier;
a protective layer on or above the carrier;
a first electrode on or above the protective layer;
an organic functional layer structure on or above the first electrode; and
a second electrode on or above the organic functional layer structure;
wherein the protective layer comprises a matrix and UV-absorbing particles, wherein the matrix comprises a glass and wherein the UV-absorbing particles are formed as scattering centers and are applied on or above the carrier, and the UV-absorbing particles being embedded in the matrix such that the protective layer has a lower transmission than the carrier for electromagnetic radiation within at least one of a plurality of respective wavelength ranges having an upper range bound value that is less than approximately 400 nm; and wherein the protective layer has a thickness in a range of 1 μm to 100 μm.

2. The optoelectronic component as claimed in claim 1, wherein the carrier is embodied in a planar fashion.

3. The optoelectronic component as claimed in claim 1, wherein the carrier comprises a soft glass or is formed therefrom.

4. The optoelectronic component as claimed in claim 3, wherein the soft glass is a soda-lime silicate glass.

5. The optoelectronic component as claimed in claim 1, wherein the matrix of the protective layer has a refractive index of greater than approximately 1.7.

6. The optoelectronic component as claimed in claim 5, wherein the matrix of the protective layer is embodied in an amorphous fashion.

7. The optoelectronic component as claimed in claim 1, wherein the matrix of the protective layer is embodied in an amorphous fashion.

8. The optoelectronic component as claimed in claim 1, wherein the matrix of the protective layer comprises or is formed from a substance or substance mixture from the group of glass systems: PbO-containing systems: PbO—$B_2O_3$, PbO—$SiO_2$, PbO—$B_2O_3$—$SiO_2$, PbO—$B_2O_3$—$ZnO_2$, PbO—$B_2O_3$—$Al_2O_3$; $Bi_2O_3$-containing systems: $Bi_2O_3$—$B_2O_3$, $Bi_2O_3$—$B_2O_3$—$SiO_2$, $Bi_2O_3$—$B_2O_3$—$ZnO$, $Bi_2O_3$—$B_2O_3$—$ZnO$—$SiO_2$.

9. The optoelectronic component as claimed in claim 8, wherein the substance or the substance mixture of the matrix further comprises or is formed from a substance from the group of substances: Ce, Fe, Sn, Ti, Pr, Eu and/or V compounds.

10. The optoelectronic component as claimed in claim 1, wherein one type of the UV-absorbing particles comprises or is formed from a substance or substance mixture or a stoichiometric compound from the group of substances: $TiO_2$, $CeO_2$, $Bi_2O_3$, ZnO, $SnO_2$, phosphors: $Ce^{3+}$ doped garnets such as YAG:Ce and LuAG, $Eu^{3+}$ doped nitrides, sulfides, SIONS, sialon, orthosilicates, chlorosilicates, chlorophosphates, BAM (barium magnesium aluminate:Eu) and/or SCAP, halophosphate, glass particles, metallic nanoparticles.

11. The optoelectronic component as claimed in claim 1, wherein the optoelectronic component is embodied as an organic light emitting diode or as an organic solar cell.

12. A method for producing an optoelectronic component, the method comprising:
    forming a protective layer on or above a carrier;
    forming a first electrode on or above the protective layer;
    forming an organic functional layer structure on or above the first electrode; and
    forming a second electrode on or above the organic functional layer structure;
        wherein the protective layer is designed having a matrix and UV-absorbing particles, the matrix comprising a glass and the UV-absorbing particles are formed as scattering centers and are applied on or above the carrier and being embedded in the matrix in such a way that the protective layer has a lower transmission of electromagnetic radiation than the carrier for electromagnetic radiation within at least one of a plurality of respective wavelength ranges having an upper range bound value that is less than approximately 400 nm; and
    wherein the protective layer is formed having a thickness in a range of 1 μm to 100 μm.

13. The method as claimed in claim 12, wherein forming the protective layer comprises applying a glass solder powder to or above the carrier, wherein the glass solder powder is liquefied in order to form the protective layer.

14. The method as claimed in claim 13, wherein the UV-absorbing particles are added to the glass solder powder before the glass solder powder is applied to the carrier.

15. The method as claimed in claim 14, the glass solder powder are applied on or above the ply of UV-absorbing scattering centers, and the glass is liquefied in such a way that one part of the liquefied glass flows between the scattering centers toward the surface of the carrier in such a way that another part of the liquefied glass remains above the scattering centers.

16. The method as claimed in claim 13, the glass solder powder are applied on or above the ply of UV-absorbing scattering centers, and the glass is liquefied in such a way that one part of the liquefied glass flows between the scattering centers toward the surface of the carrier in such a way that another part of the liquefied glass remains above the scattering centers.

* * * * *

UNITED STATES PATENT AND TRADEMARK OFFICE
CERTIFICATE OF CORRECTION

PATENT NO. : 9,478,761 B2
APPLICATION NO. : 14/396780
DATED : October 25, 2016
INVENTOR(S) : Setz et al.

It is certified that error appears in the above-identified patent and that said Letters Patent is hereby corrected as shown below:

Column 3, Line 6: Please delete "B₂O₃ZnO" between the words "Bi₂O3-" ("B₂O3ZnO" and "SiO₂" and write "B₂O₃-ZnO" in place thereof.

Column 4, Line 28: Please delete "SIGNS" between the words "sulfides," and "sialon," and write "SIONS" in place thereof.

Column 4, Line 50: Please delete "SIGNS" between the words "sulfides," and "sialon," and write "SIONS" in place thereof.

Column 6, Line 35: Please delete "SIGNS" between the words "sulfides," and "sialon," and write "SIONS" in place thereof.

Column 8, Line 42: Please delete "O₂" between the words "B₂O₃-" and "PbO-" and write "SiO₂" in place thereof.

Column 8, Line 42: Please delete "B₂O₃O₂" between the words "PbO-" and "PbO-" and write "B₂O₃-ZnO₂" in place thereof.

Column 8, Line 43: Please delete "B₂O₃Al₂O₃" between the words "PbO-" and "wherein" and write "B₂O₃-Al₂O₃" in place thereof.

Column 9, Line 25: Please delete "SIGNS" between the words "sulfides," and "sialon," and write "SIONS" in place thereof.

Column 9, Line 42: Please delete "SIGNS" between the words "sulfides," and "sialon," and write "SIONS" in place thereof.

Column 10, Line 43: Please delete "B₂O₃Al₂O₃" between the words "PbO-" and "wherein" and write "B₂O₃-Al₂O₃" in place thereof.

Signed and Sealed this
Tenth Day of April, 2018

Andrei Iancu
*Director of the United States Patent and Trademark Office*

CERTIFICATE OF CORRECTION (continued)
U.S. Pat. No. 9,478,761 B2

Column 11, Line 18: Please delete "SIGNS" between the words "sulfides," and "sialon," and write "SIONS" in place thereof.

Column 18, Line 42: Please delete "$In_2O_2$" between the words "or" and "ternary" and write "$In_2O_3$" in place thereof.

Column 18, Line 44: Please delete "$CdSnO_2$" between the words "$Zn_2SnO_4$" and "$ZnSnO_2$" and write "$CdSnO_3$" in place thereof.

Column 18, Line 44: Please delete "$ZnSnO_2$" between the words "$CdSnO_2$" and "$MgIn_2O_4$" and write "$ZnSnO_3$" in place thereof.

Column 18, Line 44: Please delete "$GaInO_2$" between the words "$MgIn_2O_4$" and "$Zn_2In_2O_5$" and write "$GaInO_3$" in place thereof.